US012699004B1

(12) United States Patent
Jafari-Salim et al.

(10) Patent No.: US 12,699,004 B1
(45) Date of Patent: Aug. 4, 2026

(54) INTEGRATED SUPERCONDUCTING NANOWIRE DIGITAL PHOTON DETECTOR

(71) Applicant: SeeQC, Inc., Elmsford, NY (US)

(72) Inventors: Amir Jafari-Salim, Yonkers, NY (US); Daniel Yohannes, Stamford, CT (US); Oleg A. Mukhanov, Putnam Valley, NY (US); Alan M. Kadin, Princeton Junction, NJ (US)

(73) Assignee: SeeQC Inc., Elmsford, NY (US)

( * ) Notice: Subject to any disclaimer, the term of this patent is extended or adjusted under 35 U.S.C. 154(b) by 138 days.

(21) Appl. No.: 18/829,241

(22) Filed: Sep. 9, 2024

Related U.S. Application Data

(63) Continuation of application No. 18/241,816, filed on Sep. 1, 2023, now Pat. No. 12,098,949, which is a
(Continued)

(51) Int. Cl.
*G01J 1/44* (2006.01)
*G01J 1/04* (2006.01)
(Continued)

(52) U.S. Cl.
CPC .............. *G01J 1/44* (2013.01); *G01J 1/0425* (2013.01); *G06F 1/10* (2013.01); *H10N 60/84* (2023.02); *G01J 2001/442* (2013.01)

(58) Field of Classification Search
CPC ...... G01J 1/44; G01J 1/0425; G01J 2001/442; G06F 1/10; H10N 60/84
See application file for complete search history.

(56) References Cited

U.S. PATENT DOCUMENTS

| 4,817,581 A | 4/1989 | Trentadue |
| 5,055,158 A | 10/1991 | Gallagher et al. |
| (Continued) | | |

FOREIGN PATENT DOCUMENTS

WO       WO 2011040809       4/2011

OTHER PUBLICATIONS

Akhlaghi, M., et al., Waveguide integrated superconducting single-photon detectors implemented as near-perfect absorbers of coherent radiation, Nature Communications, 2015, www.nature.com/articles/ncomms9233.

(Continued)

*Primary Examiner* — Tony Ko
(74) *Attorney, Agent, or Firm* — Hoffberg & Associates; Steven M. Hoffberg

(57) ABSTRACT

Superconducting nanowire single photon detectors have recently been developed for a wide range of applications, including imaging and communications. An improved detection system is disclosed, whereby the detectors are monolithically integrated on the same chip with Josephson junctions for control and data processing. This enables an enhanced data rate, thereby facilitating several new and improved applications. A preferred embodiment comprises integrated digital processing based on single-flux-quantum pulses. An integrated multilayer fabrication method for manufacturing these integrated detectors is also disclosed. Preferred examples of systems comprising such integrated nanowire photon detectors include a time-correlated single photon counter, a quantum random number generator, an integrated single-photon imaging array, a sensitive digital communication receiver, and quantum-key distribution for a quantum communication system.

20 Claims, 18 Drawing Sheets

Related U.S. Application Data continuation of application No. 17/862,276, filed on Jul. 11, 2022, now Pat. No. 11,747,196, which is a continuation of application No. 16/016,149, filed on Jun. 22, 2018, now Pat. No. 11,385,099.

(60) Provisional application No. 62/524,881, filed on Jun. 26, 2017.

(51) Int. Cl.
*G06F 1/10* (2006.01)
*H10N 60/84* (2023.01)

(56) References Cited

U.S. PATENT DOCUMENTS

| | | | |
|---|---|---|---|
| 6,342,701 B1 | 1/2002 | Kash | |
| 6,653,962 B2 | 11/2003 | Gupta et al. | |
| 6,812,464 B1 | 11/2004 | Sobolewski et al. | |
| 7,049,593 B2 | 5/2006 | Sobolewski et al. | |
| 7,078,694 B2 | 7/2006 | Polonsky et al. | |
| 7,284,024 B1 | 10/2007 | Trifonov et al. | |
| 7,615,385 B2 | 11/2009 | Tolpygo | |
| 7,638,751 B2 | 12/2009 | Dauler et al. | |
| 7,891,903 B2 | 2/2011 | Klingenberg et al. | |
| 8,301,214 B1 | 10/2012 | Tolpygo et al. | |
| 8,565,844 B2 | 10/2013 | Smith | |
| 8,571,614 B1 | 10/2013 | Mukhanov et al. | |
| 8,577,430 B1 | 11/2013 | Smith | |
| 8,761,848 B2 | 6/2014 | Berggren et al. | |
| 8,872,109 B2 | 10/2014 | Ohkubo et al. | |
| 8,951,808 B2 | 2/2015 | Ladizinsky et al. | |
| 9,076,907 B2 | 7/2015 | Englund et al. | |
| 9,240,539 B2 | 1/2016 | Nam et al. | |
| 9,500,519 B2 | 11/2016 | Tang et al. | |
| 9,509,315 B2 | 11/2016 | McCaughan et al. | |
| 2013/0143744 A1 | 6/2013 | Marsili et al. | |
| 2013/0172195 A1 | 7/2013 | Bellei et al. | |
| 2013/0187051 A1 | 7/2013 | McCaughan et al. | |
| 2014/0353476 A1 | 12/2014 | Bachar et al. | |
| 2015/0119253 A1 | 4/2015 | Yohannes et al. | |
| 2016/0352515 A1 | 12/2016 | Bunandar et al. | |
| 2017/0026174 A1 | 1/2017 | Pang et al. | |
| 2017/0026175 A1 | 1/2017 | Zhang et al. | |
| 2018/0348310 A1* | 12/2018 | Martinis | G01R 33/035 |
| 2025/0007462 A1* | 1/2025 | Yamamoto | H03B 15/003 |
| 2025/0284924 A1* | 9/2025 | Béjanin | G06N 3/02 |

OTHER PUBLICATIONS

Allman, M., et al., "Near-IR 64-pixel SNSPD array with integrated multiplexed readout", Applied Physics Letters, vol. 106, article 192601, 2015.

Annunziata, A., et al., Nb SNSPDs, IEEE Transactions on Applied Superconductivity, 2009 arxiv.org/ftp/arxiv/papers/0901/0901.1146. pdf.

Atikian, H., SNSPD on Diamond, Applied Physics Letters, 2014, https://arxiv.org/pdf/1401.4490.pdf.

Baek, B., et al., SNSPD in an optical cavity for front-sie illumination, Applied Physics Letters, 2009, ws680.nist.gov/publication/get_pdf.cfm?pub_id=903071.

Beyer, A., et al., WSi superconducting nanowire single-photon test structures fabricated using optical lithography, IEEE Transactions on Applied Superconductivity, 2015, www.researchgate.net/profile/Adriana_Lita/publication/273918634_Tungsten_Silicide_Superconducting_Nanowire_Single-Photon_Test_Structures_Fabricated_Using_Optical_Lithography/.

Brandel, O. et al, "RSFQ electronics for controlling superconducting polarity switches", Superconductor Science and Technology, vol. 25, No. 12 (Oct. 25, 2012) iopscience.iop.org/article/10.1088/0953-2048/25/12/125012/meta.

Calandri, N., et al., Superconducting nanowire detector jitter limited by detector geometry, Applied Physics Letters, 2016, arxiv.org/ftp/arxiv/papers/1607/1607.06713.pdf.

Casaburi, M., et al, "Subnanosecond time response of large-area superconducting stripline detectors for keV molecular ions", Applied Physics Letters, vol. 94, article 212502, 2009.

Chen, S., et al., Time-of-flight laser ranging and imaging at 1550 nm using low-jitter superconducting nanowire single-photon detection system, Applied Optics, 2013. arxiv.org/ftp/arxiv/papers/1304/1304.7447.pdf.

Cheng, R, et al., Self-aligned multichannel superconducting nanowire avalanche photodetector, ArXiv preprint, 2016, arxiv.org/abs/1601.01719.

Cheng, R., et al., Large-Area Superconducting Nanowire Single-Photon Detector With Double-Stage Avalanche Structure, IEEE Transactions on Applied Superconductivity, 2017. arxiv.org/ftp/arxiv/papers/1612/1612.05822.pdf.

Dauler, E., et al. "1.25 Gbit/s photon counting optical communications using a two-element SNSPD", in Advanced Photon Counting Techniques, SPIE 6372, article 637212, 2006.

Dauler, E., et al., "High-rate quantum key distribution with SNSPDs", Proc. Conference on Lasers and Electro-optics (CLEO) 2010;.

Dauler, E., et al., "Review of SNSPD system design options and demonstrated performance", Optical Engineering, vol. 53, article 081907, 2014.

Doerner, S., et al., "Operation of multi-pixel RF SNSPD arrays", IEEE Transactions on Applied Superconductivity, vol. 27, article 2201005, 2017.

Doerner, S., et al., Operation of Multi-Pixel Radio-Frequency Superconducting Nanowire Single-Photon Detector Arrays, IEEE Transactions on Applied Superconductivity, 2017. arxiv.org/ftp/arxiv/papers/1612/1612.02228.pdf.

Ferrari, S., et al., Hot-spot relaxation time current dependence in niobium nitride waveguide-integrated superconducting nanowire single-photon detectors, Optics Express, 2017. www.osapublishing.org/abstract.cfm?uri=oe-25-8-8739.

Gaudio, R., et al., Inhoogeneous critical current in nanowire superconducting single photon detectors, Applied Physics Letters, 2014, arxiv.org/ftp/arxiv/papers/1412/1412.0416.pdf.

Gerrits, T. et al., "Progress toward a high-resolution single photon camera based on SNSPD arrays and compressive sensing", Conference on Lasers and Electro-Optics (CLEO), paper STh30.6, 2015.

Grein, M., et al., "Optical Receiver for the Lunar Laser Communication Demonstration based on Photon Counting Superconducting Nanowires", SPIE vol. 9492, 2015.

Gupta, D. and Kadin, A., "Single-photon-counting hotspot detector with integrated RSFQ readout electronics", IEEE Transactions on Applied Superconductivity, vol. 9, p. 4487, 1999.

Gupta, D., et al., "High-speed data transmission technology for superconducting multi-chip modules", IEEE Transactions on Applied Superconductivity, vol. 11, p. 731, 2001.

Hadfield, R., "Single-photon detectors for optical quantum information applications", Nature Photonics, vol. 3, p. 696, 2009.

He, Y., et al., "Bias-free true random number generation using SNSPDs", Superconductor Science and Technology, vol. 29, article 085005, 2016.

Heath, R., et al., "Nano-optical observation of cascade switching in parallel SNSPD", Applied Physics Letters, vol. 104, article 063503, Feb. 2014.

Hu, X., et al., SNSPDs integrated with optical nano-antennae, Optics Express, 2011, www.osapublishing.org/oe/abstract.cfm?uri=oe-19-1-17.

Ivry, Y., et al., Superconducting-superconducting hybridization for enhancing single-photon detection, ArXiv preprint 2017. //arxiv.org/abs/1703.08034.

Kahl, O., et al., "Spectrally resolved single-photon imaging with hybrid superconducting—nanophotonic circuits", ArXiv preprint, 2016. arxiv.org/abs/1609.07857.

Kahl, O., et al., "Waveguide integrated SNSPDs with high internal quantum efficiency at telecom wavelengths", Scientific Reports, vol. 5, article 10941, 2015.

(56)          References Cited

OTHER PUBLICATIONS

Kaplan, S., et al., "Prescalar circuit for superconductive time-to-digital converter," IEEE Transactions on Applied Superconductivity, vol. 11, p. 513, 2001.

Kerman, A., et al., "Electrothermal feedback in SNSPDs", Physical Review B, vol. 79, article 100509, 2009.

Kerman, A., et al., Readout of SNSPDs at high count rates, Journal of Applied Physics, 2013, arxiv.org/pdf/1302.2852.pdf.

Kitaygorsky, J., et al., Amplitude distributions of dark counts and photon counts in NbN superconducting single-photon detectors integrated with the HEMT readout, Physica C: Superconductivity, 2017.

Li, H., et al., Superconducting nanowire single photon detector at 532 nm and demonstration in satellite laser ranging, Optics Express 2016, www.osapublishing.org/oe/abstract.cfm?uri=oe-24-4-3535.

Li, J., et al., Nano-optical single-photon response mapping of waveguide integrated MoSi superconducting nanowires, Optics Express, 2016, www.osapublishing.org/oe/abstract.cfm?uri=oe-24-13-13931.

Lita, A., et al., Materials development for high efficiency SNSPDs, Materials Research Society Proceedings, 2015, ws680.nist.gov/publication/get_pdf.cfm?pub_id=918625.

Liu, D.K., et al., "Non-latching SNSPD with quasi-constant voltage bias", Applied Physics Express, vol. 5, article 125202, 2012.

Lobanov, Y., et al., "SNSPD for coherent detection of weak signals", IEEE Transactions on Applied Superconductivity, vol. 28, article 2200705, 2017.

Lobanov, Y., et al., Heterodyne spectroscopy with superconducting single-photon detector, EPJ Web of Conferences, 2017.

Marsili, F., et al., High efficiency NbN nanowire superconducting single photon detectors fabricated on MgO substrates from a low temperature process, Optics Express 2008 www.osapublishing.org/oe/abstract.cfm?uri=oe-16-5-3191.

Mattioli, F., et al., "Photon counting and analog operation of 24-pixel photon-number-resolving detector based on superconducting nanowires", Optics Express, vol. 24, p. 9067, 2016.

Mei, Y., et al., Fabrication of superconducting NbN meander nanowires by nano-imprint lithography, Chinese Physics B, 2016, cpb.iphy.ac.cn/article/2016/1806/cpb_25_1_17401.html.

Miki, D., et al., "Technologies for SNSPD array system", SPIE vol. 8727, article 872708, 2013.

Miki, S., et al., "Development of SNSPD system with Gifford-MacMahon Cryocooler", IEEE Transactions on Applied Superconductivity, vol. 19, p. 332, 2009.

Miki, S., et al., Stable, high-performance operation of a fiber-coupled superconducting nanowire avalanche photon detector, Optics Express, 2017 www.osapublishing.org/oe/abstract.cfm?uri=oe-25-6-6796.

Mukhanov, O., and S. Rylov, "Time to digital converters based on RSFQ digital counters", IEEE Transactions on Applied Superconductivity, vol. 7, p. 2269, 1997.

Najafi, F., et al., "On-chip detection of non-classical light by scalable integration of single-photon detectors," Nature Communications, vol. 6, article 5873, 2015, www.nature.com/articles/ncomms6873.

Najafi, F., et al., Fabrication process yielding saturated nanowire single photon detectors with 24-ps jitter, IEEE Journal of Selected Topics in Quantum Electronics, 2015. dspace.mit.edu/openaccess-disseminate/1721.1/102455.

Natarajan, C. M., M. G. Tanner, and R. H. Hadfield, "Superconducting nanowire single-photon detectors: physics and applications," Superconductor Science and Technology 25, 063001 (2012), doi: 10.1088/0953-2048/25/6/063001, arXiv:1204.5560.

Natarajan, C., M. Tanner, and R. Hadfield, "SNSPDs: Physics and Applications", Superconductor Science and Technology, vol. 25, article 063001, Apr. 2012.

Ornl, "Plasmonics: A promising path for Future Interconnects", The Next Wave, v.20, No. 3, pp. 12-18 (2014) www.nsa.gov/resources/everyone/digital-media-center/publications/the-next-wave/assets/files/TNW-20-3.pdf.

Ortlepp, T., et al, "Demonstration of digital readout circuit for SNSPD", Optics Express, vol. 19, p. 18593, 2011.

Rath, P., et al., Superconducting single-photon detectors integrated with diamond nanophotonic circuits, Light: Science and Applications, 2015. www.nature.com/lsa/journal/v4/n10/full/lsa2015111a.html.

Romestain, R., et al. "Fabrication of a superconducting niobium nitride hot electron bolometer for single-photon counting." New Journal of Physics 6.1 (2004): 129. www.researchgate.net/profile/Corentin_Jorel/publication/230985905_Fabrication_of_a_superconducting_niobium_nitride_hot_electron_bolometer_for_single-photon_counting/links/0a85e5310b813a791c000000.pdf.

Rosfjord, K., et al., Nanowire single photon detector with an integrated optical cavity and antireflection coating, Optics Express 2006, www.osapublishing.org/oe/abstract.cfm?uri=oe-14-2-527.

Sahu, A., et al., "Digital time-division multiplexing readout circuit for sensor arrays", IEEE Transactions on Applied Superconductivity, vol. 27, article 2500106, 2017.

Sarwana, S., et al., "High-sensitivity, high-resolution dual-function signal and time digitizer", Applied Physics Letters, vol. 80, p. 2023, 2002.

Schmidt, K., et al., AIN-buffered superconducting NbN nanowire singlephoton detector on GaAs, IEEE Transactions on Applied Superconductivity, 2017, arxiv.org/ftp/arxiv/papers/1609/1609.09694.pdf.

Schuck, C., et al, NbTiN superconducting nanowire detectors for visible and telecom wavelengths single photon counting on Si3N4 photonic circuits, Applied Physics Letters, 2013, arxiv.org/ftp/arxiv/papers/1302/1302.0786.pdf.

Shainline, J., et al., Superconducting optoelectronic circuits for neuromorphic computing, ArXiv Preprint 2016, arxiv.org/abs/1610.00053.

Shubata, H., et al., Ultimate low system dark count rate for SNSPD, Optics Letters, 2015, www.osapublishing.org/ol/abstract.cfm?uri=ol-40-14-3428.

Sibson, P., et al., Chip-based quantum key distribution, Nature Communications, 2017 www.ncbi.nlm.nih.gov/pmc/articles/PMC5309763/.

Slichter, D., et al., UV-sensitive superconducting nanowire single photon detectors for integration in an ion trap, ArXiv preprint, 2016, arxiv.org/abs/1611.09949.

Slysz, W., et al, "Fiber coupled single photon detectors based on NbN superconducting nanostructures for practical quantum cryptography and photon correlation", Applied Physics Letters, vol. 88, article 261113, 2006.

Smirnov, K., et al., Rise times of voltage pulses in NbN superconducting single photon detectors, Applied Physics Letters, 2016, arxiv.org/ftp/arxiv/papers/1606/1606.04860.pdf.

Sprengers, J., et al., Waveguide single-photon detectors for integrated quantum photonic circuits, Applied Physics Letters, 2011, arxiv.org/ftp/arxiv/papers/1108/1108.5107.pdf.

Stern, J., and W. Farr, Fabrication and characterization of NbN SNSPDs, IEEE Transactions on Applied Superconductivity, 2007, trs.jpl.nasa.gov/bitstream/handle/2014/40253/06-2657.pdf.

Stevens, M., et al., "Time-correlated single photon counting with superconducting single-photon detectors", SPIE vol. 6372, 2006.

Szete, M., et al, Plasmonic structure integrated single-photon detectors optimized to maximize polarization contrast, IEEE Photonics Journal, 2017 ieeexplore.ieee.org/stamp/stamp.jsp?arnumber=7891903.

Takemoto, K., et al., "Quantum key distribution over 120 km using ultra-high-purity single photon source and superconducting single-photon detectors", Scientific Reports, vol. 5, article 14383, 2015.

Tanner, M., et al., "Enhanced telecom wavelength single-photon detection with NbTiN superconducting nanowires on oxidized silicon", Applied Physics Letters, vol. 96, article 221109, 2010, authors.library.caltech.edu/65316/1/Enhanced_telecome.pdf.

Tanner, M., et al., SNSPD on Lithium Niobate, Nanotechnology, 2012, publicationslist.org/data/r.j.warburton/ref-528/Tanner_Nanotechnology_2012.pdf.

Terai, T., et al., "Low-jitter SFQ signal readout from SNSPD", Optics Express, vol. 20, p. 20115, 2012.

(56) References Cited

OTHER PUBLICATIONS

Toussaint, J., et al, "Superconducting single-photon counting system for optical experiments requiring time resolution in the ps range", Reviews of Scientific Instruments, vol. 83, article 123103, 2012.

Trifonov, A. and H. Vig, "Quantum random noise number generator"; also Herrero-Galantes, M., "Quantum random number generators", Reviews of Modern Physics, vol. 89, 015004 (2017).

Tyler, N., et al., Modelling superconducting nanowire single photon detectors in a waveguide cavity, Optics Express, 2016, www.osapublishing.org/oe/abstract.cfm?uri=oe-24-8-8797.

Verma, V., et al., High efficiency SNSPDs fabricated from MoSi thin films, Optics Express 2015, www.osapublishing.org/oe/abstract.cfm?uri=oe-23-26-33792.

Verma, V., et al., SNSPDs fabricated from an amorphous MoGe film, Applied Physics Letters, 2014, arxiv.org/ftp/arxiv/papers/1402/1402.4526.pdf.

Vorobyov, V., et al, Superconducting detector for visible and near-infrared quantum emitters, Optical Materials Express, 2017, www.osapublishing.org/ome/abstract.cfm?uri=ome-7-2-513.

Wang, Z., et al., "SNSPDs for quantum information and communication", IEEE Journal of Selected Topics in Quantum Electronics, 2009, arxiv.org/ftp/arxiv/papers/1003/1003.0227.pdf.

Wu, J., et al., Improving the timing jitter of a superconducting nanowire single-photon detection system, Applied Optics, 2017 www.osapublishing.org/abstract.cfm?uri=ao-56-8-2195.

Xu, F., et al., Experimental fast quantum random number generation using high-dimensional entanglement with entropy monitoring, Optica, 2016, www.osapublishing.org/optica/abstract.cfm?uri=optica-3-11-1266.

Yamashita, T., et al., Origin of intrinsic dark count in SNSPDs, Applied Physics Letters, 2011, arxiv.org/pdf/1103.2844.

Yamashita, T., et al., Superconducting nanowire single-photon detectors with non-periodic dielectric multilayers, Scientific Reports, 2016, www.ncbi.nlm.nih.gov/pmc/articles/PMC5076433/.

Yamashita, T., S. Miki, and H. Terai, "Recent progress and application of SNSPDs," IEICE Transactions on Electronics, vol. E100-C, p. 274, Mar. 2017.

Yang, J., et al., Fabrication development for nanowire GHz-counting-rate single photon detectors, IEEE Transactions on Applied Superconductivity, 2005, www.dtic.mil/dtic/tr/fulltext/u2/a574649.pdf.

You, L., et al., Jitter analysis of SNSPD, AIP Advances, 2013. aip.scitation.org/doi/pdf/10.1063/1.4817581.

Zadeh, I., et al., Single-photon detectors combining near unity efficiency, ultra-high detection-rates, and ultra-high time resolution, ArXiv preprint, 2016, arxiv.org/abs/1611.02726.

Zhang, W., et al., Superconducting Nanowire Single-Photon Detector With a System Detection Efficiency Over 80% at 940-nm Wavelength, IEEE Photonics Journal, 2016, ieeexplore.ieee.org/abstract/document/7434560/.

Zhao, Q. et al., "Single-Photon Imager Based on Microwave Plasmonic Superconducting Nanowire" (2016) arxiv.org/ftp/arxiv/papers/1605/1605.08693.pdf.

Zhao, Q., et al., SNSPD linear array, Applied Physics Letters, 2013, dspace.mit.edu/openaccess-disseminate/1721.1/85962.

Zhao, Qing-Yuan, et al. "Single-photon imager based on a superconducting nanowire delay line." Nature Photonics 11.4 (2017): 247-251. www.nature.com/nphoton/journal/v11/n4/full/nphoton.2017.35.html.

En.wikipedia.org/wiki/Rapid_single_flux_quantum.

En.wikipedia.org/wiki/SQUID.

Www.epj-conferences.org/articles/epjconf/pdf/2017/01/epjconf_spectro2017_01005.pdf.

Www.qnp.aphys.kth.se/polopoly_fs/1.694393!/1-s2.0-S0921453416302374-main.pdf.

* cited by examiner

INTEGRATED SUPERCONDUCTING NANOWIRE DIGITAL PHOTON DETECTOR

CROSS REFERENCE TO RELATED APPLICATIONS

The present application is a Continuation of U.S. patent application Ser. No. 18/241,816, filed Sep. 1, 2023, now U.S. Pat. No. 12,098,949, issued Sep. 24, 2024, which is a Continuation of U.S. patent application Ser. No. 17/862,276, filed Jul. 11, 2022, now U.S. Pat. No. 11,747,196, issued Sep. 5, 2023, which is a Continuation of U.S. patent application Ser. No. 16/016,149, filed Jun. 22, 2018, now U.S. Pat. No. 11,385,099, issued Jul. 12, 2022, which is a non-provisional of, and claims benefit of priority from, U.S. Provisional Patent Application No. 62/524,881, filed Jun. 26, 2017, the entirety of which are expressly incorporated herein by reference.

FIELD OF THE INVENTION

The present invention relates to the field of Superconducting Nanowire Single Photon Detectors.

BACKGROUND OF THE INVENTION

Each patent or non-patent reference cited herein is expressly incorporated herein by reference in its entirety.

Superconducting nanowires are well known for their ability to detect single photons, by formation of a localized hotspot at a position along the wire. These devices are generally known as Superconducting Nanowire Single Photon Detectors, or SNSPDs (see en.wikipedia.org/wiki/Superconducting_nanowire_single-photon_detector, expressly incorporated herein by reference). Earlier, "nanowire" was often left out of the acronym, yielding SSPD. The narrow nanowire may be of order 10 nm thick and 100 nm wide, and is typically patterned into a meander line in order to maintain high quantum efficiency over a local region, as shown in FIG. 1A. With an appropriate temperature and current bias, these nanowires may be sensitive to infrared, visible, and ultraviolet single photons. The original SNSPDs were based on ultrathin films of superconducting niobium nitride (NbN), with critical temperature $T_c>10$ K, with some more recent devices based on other materials such as NbTiN, TiN, WSi, Nb, MoSi, MoGe, MoN, TaN, and WRe.

The device operates at a temperature significantly below $T_c$ (typically half of $T_c$ or less), and is biased with a current slightly below the critical current $I_c$ (typically around 90% of $I_c$), which may typically be of order 10 μA. When a photon is absorbed, the local electron temperature in the hotspot rises, depressing the local value of $I_c$, so that the current/is now above the critical current, causing the device to switch to the resistive state, at least for a section of the nanowire, generating a voltage along the wire. This is typically hysteretic, as shown in FIG. 1B, since the heat generated by the resistive hotspot is sufficient to maintain it above $T_c$. Therefore, recovery requires that much of the current be diverted to a load R (not shown), enabling the device to cool down to the ambient temperature, into the fully superconducting state. A series of absorbed photons will lead to a sequence of voltage pulses, as shown in FIG. 1C.

The speed of SNSPDs can be fast, but not fast enough for some potential applications. For example, FIG. 1C shows a voltage pulse with recovery (reset) on the nanosecond (ns) timescale. For this reason, photon count rates of order 1 GHz or greater are difficult to achieve. High count rates are desired for two applications: high data rates for optical communication, and high dynamic range for imaging.

The primary factor limiting the recovery time is the kinetic inductance L of the nanowire. Kinetic inductance is a property of superconducting wires that is associated not with magnetic fields, but rather with the kinetic energy of the superconducting electrons (see en.wikipedia.org/wiki/Kinetic_inductance). For a thin meander-line structure, the usual magnetic inductance is suppressed, and the kinetic inductance is dominant. For a superconducting material with penetration depth $\lambda_L$, and a thin film of thickness $d \ll \lambda_L$, the kinetic inductance per square (the sheet inductance) is given by $Lsq=\mu_0\lambda_L^2/d$, where $\mu_0=1.26$ μH/m is the permeability of free space. The thickness d must be very small in order that the nanowire be sensitive to low-energy photons. For NbN thin films with $\lambda_L \sim 400$ nm, taking d=5 nm, this gives Lsq~40 pH/sq. For a long meander line with width w=100 nm packed into a 4 □m square, the total inductance L~30 nH. Combined with a load resistance R~50 ohms (and a nanowire resistance in the hotspot state in the kiloOhm range), this gives a characteristic time L/R close to 1 ns, leading to a pulsewidth on this timescale.

It was recognized in the prior art that reducing the length of the meander line (and hence reducing the kinetic inductance) could lead to a faster device. For example, U.S. Pat. No. 7,638,751, Dauler et al., "Multi-element optical detectors with sub-wavelength gaps", disclosed splitting up an SNSPD into two or more shorter meander lines that are separately biased and measured. US 2013/0143744, Marsili et al., "Superconducting nanowire avalanche photodetectors with reduced reset time", disclose two or more nanowires biased in parallel, such that switching of one nanowire causes redistribution of the current to the other nanowire(s), thus triggering all of the nanowires. A similar parallel scheme was disclosed in M. Ejrnaes et al, "Characterization of parallel SNSPDs", Superconductor Science and Technology, vol. 22, article 055006, 2009. However, these parallel approaches are not scalable to more than about 5 parallel lines, since then the avalanche effect would not occur reliably, and the device output would be effectively shorted.

Another important aspect of the photon-induced pulse is its measured onset time, which can be much more precise than the pulsewidth, picoseconds rather than nanoseconds. The uncertainty in the pulse onset time is known as the timing jitter. For example, the prior art reports a timing jitter of 35 ps in an SNSPD with a pulse width (reset time) of 3 ns (see Dauler et al., 2006, cited below). A long meander line will have a relatively larger jitter associated with the propagation delay of the pulse from the (uncertain) location of the photon absorption along the line. A shorter nanowire will tend to have a reduced timing jitter.

Other prior art citations relevant to fast SNSPDs include:

Casaburi, M., et al, "Subnanosecond time response of large-area superconducting stripline detectors for keV molecular ions", Applied Physics Letters, vol. 94, article 212502, 2009.

Dauler, E., et al. "1.25 Gbit/s photon counting optical communications using a two-element SNSPD", in Advanced Photon Counting Techniques, SPIE 6372, article 637212, 2006.

Heath, R., et al., "Nano-optical observation of cascade switching in parallel SNSPD", Applied Physics Letters, vol. 104, article 063503, February 2014.

Liu, D. K., et al., "Non-latching SNSPD with quasi-constant voltage bias", Applied Physics Express, vol. 5, article 125202, 2012.

SNSPDs are being developed for both digital communication (both classical and quantum) and focal-plane imaging. See, for example, US 2013/0187051, McCaughan et al., "Frequency multiplexed SNSPDs".

US 2016/0352515, Bunandar et al, Apparatus and methods for quantum key distribution.

US 2017/0026174, Zhang et al., Methods for Quantum Key Distribution and related devices.

U.S. Pat. No. 9,076,907, Englund et al, Compactly integrated optical detectors and associated systems and methods.

See also the following articles related to communication and imaging with SNSPDs:

Allman, M., et al., "Near-IR 64-pixel SNSPD array with integrated multiplexed readout", Applied Physics Letters, vol. 106, article 192601, 2015.

Dauler, E., et al., "High-rate quantum key distribution with SNSPDs", Proc. Conference on Lasers and Electro-optics (CLEO) 2010.

Doerner, S., et al., "Operation of multi-pixel RF SNSPD arrays", IEEE Transactions on Applied Superconductivity, vol. 27, article 2201005, 2017.

Gerrits, T. et al., "Progress toward a high-resolution single photon camera based on SNSPD arrays and compressive sensing", Conference on Lasers and Electro-Optics (CLEO), paper STh30.6, 2015.

Grein, M., et al., "Optical Receiver for the Lunar Laser Communication Demonstration based on Photon Counting Superconducting Nanowires", SPIE vol. 9492, 2015.

He, Y., et al., "Bias-free true random number generation using SNSPDs", Superconductor Science and Technology, vol. 29, article 085005, 2016.

Kahl, O., et al., "Waveguide integrated SNSPDs with high internal quantum efficiency at telecom wavelengths", Scientific Reports, vol. 5, article 10941, 2015.

Lobanov, Y., et al., "SNSPD for coherent detection of weak signals", IEEE Transactions on Applied Superconductivity, vol. 28, article 2200705, 2017.

Mattioli, F., et al., "Photon counting and analog operation of 24-pixel photon-number-resolving detector based on superconducting nanowires", Optics Express, vol. 24, p. 9067, 2016.

Miki, D., et al., "Technologies for SNSPD array system", SPIE vol. 8727, article 872708, 2013.

Najafi, F., et al., "On-chip detection of non-classical light by scalable integration of single-photon detectors," Nature Communications, vol. 6, article 5873, 2015.

Natarajan, C. M., M. G. Tanner, and R. H. Hadfield, "Superconducting nanowire single-photon detectors: physics and applications," Superconductor Science and Technology 25, 063001 (2012), doi: 10.1088/0953-2048/25/6/063001, arXiv: 1204.5560.

Slysz, W., et al, "Fiber coupled single photon detectors based on NbN superconducting nanostructures for practical quantum cryptography and photon correlation", Applied Physics Letters, vol. 88, article 261113, 2006.

Tanner, M., et al., "Enhanced telecom wavelength single-photon detection with NbTiN superconducting nanowires", Applied Physics Letters, vol. 96, article 221109, 2010.

Toussaint, J., et al, "Superconducting single-photon counting system for optical experiments requiring time resolution in the ps range", Reviews of Scientific Instruments, vol. 83, article 123103, 2012.

Wang, Z., et al., "SNSPDs for quantum information and communication", IEEE Journal of Selected Topics in Electronics, vol. 15, p. 1741, 2009.

Another important aspect of an SNSPD is the measurement of the voltage pulses. In most devices of the prior art, as shown in FIG. 2, the voltage pulses are conducted out of the cryogenic environment up to an amplifier, pulse discriminator, and pulse counter using conventional electronics at room temperature. This requires that the voltage pulses be relatively large and not too fast, so that they can be conducted several meters without significant attenuation or noise.

An alternative approach would be to carry out the pulse electronic processing at cryogenic temperature close to the SNSPD. One cryogenic technology that is well matched to SNSPDs is superconducting logic, particularly rapid-single-flux-quantum logic (RSFQ) based on Josephson junctions and single-flux-quantum voltage pulses (see en.wikipedia.org/wiki/Rapid_single_flux_quantum, expressly incorporated herein by reference).

FIGS. 3A and 3B show some key aspects of RSFQ logic in the prior art. FIG. 3A shows the schematic of an ideal Josephson junction that is shunted by a capacitor and a resistor. The ideal junction itself is essentially a small nonlinear inductance. Since a Josephson junction typically consists of two layers of a superconductor (such as Nb) separated by a very thin (1 nm) layer of an insulator (such as aluminum oxide), the capacitor is unavoidable. The nonlinear inductance and the capacitance create an LC resonator. For most practical applications of Josephson junctions, the junction must also have an effective resistive shunt for damping. This may be an external resistor, or in some cases intrinsic internal resistance is sufficient. The standard simplified model of a practical Josephson junction is the shunted junction model, with a current-voltage characteristic as shown in FIG. 3B. All Josephson junctions discussed in this application are damped in this way, though this is not a limitation of the technology. For current slightly larger than the critical current $I_c$, the voltage rises almost vertically, before turning toward a resistive response. This represents a dc average voltage, but the instantaneous junction characteristic actually consists of a series of ultrafast voltage pulses on the ps scale, as shown in FIG. 3C. Each pulse is a single-flux-quantum (SFQ) pulse with voltage about 1 mV and pulsewidth about 2 ps, so that the integrated voltage $\int V_{(t)} dt = \Phi_0 = h/2e = 2$ mV-ps. RSFQ logic circuits can perform counting, timing, and digital logic on these pulses. RSFQ circuits can operate up to ~100 GHz, with a power dissipation that is orders of magnitude less than conventional semiconductor electronics. Note that the SFQ pulses in FIG. 3C are both lower amplitude and much faster than the SNSPD pulses in FIG. 1C. The characteristic impedance of Josephson junctions and RSFQ circuits is typically small, on the order of a few ohms, in contrast to the kiloOhms of typical SNSPDs.

In standard RSFQ circuits, most of the power dissipated is due to resistors in the current bias distribution network. More recently, Mukhanov et al, U.S. Pat. No. 8,571,614, "Low-Power Biasing Networks for Superconducting Integrated Circuits" have disclosed a family of energy-efficient RSFQ circuits where the current bias network reduces power dissipation by using superconducting inductors and Josephson junctions instead of resistors. An example is shown in FIG. 4, taken from this patent, where several RSFQ cells are biased in parallel, each parallel leg comprising an inductor in series with a Josephson junction. The critical current $I_c$ of the Josephson junction defines the operating point of the current bias in that leg. This example contains no nanowire detectors.

Another aspect of the prior art that is employed in the present invention is a "Superconducting QUantum Interference Device" or SQUID (see en.wikipedia.org/wiki/ SQUID). FIG. 5A shows a SQUID of the prior art, consisting of two (shunted) Josephson junctions biased in parallel, which define an inductive loop. A control line may be configured to couple magnetic flux into the loop, which modulates the critical current $I_c$ of the SQUID. While a SQUID may be employed as a sensitive detector of weak magnetic fields, here one can consider the SQUID as a tunable Josephson junction. Note that a SQUID is designed so that the loop inductance $L\sim\Phi_0/I_c$. For a larger value of L, the superconducting loop can be used as a memory cell to store one or more flux quanta.

The concept of using RSFQ circuits to read out data from superconducting nanowires was first proposed many years ago by Gupta and Kadin, "Single-photon-counting hotspot detector with integrated RSFQ readout electronics", IEEE Transactions on Applied Superconductivity, vol. 9, p. 4487, 1999. However, the proposed circuit implementation (using a SQUID-coupled pickup) shown in FIG. 6 (taken from this article) was intended to measure the detailed shape of nanowire pulses, and possibly provide spectral information. Furthermore, it was designed for a different regime of operation, and never actually implemented. Since then, several researchers have disclosed hybrid connections of an SNSPD with RSFQ readout electronics, on different chips but within the same cryogenic environment. These include:

Ortlepp, T., et al, "Demonstration of digital readout circuit for SNSPD", Optics Express, vol. 19, p.18593, 2011.

Terai, T., et al., "Low-jitter SFQ signal readout from SNSPD", Optics Express, vol. 20, p.20115, 2012.

But an actual integrated implementation of SNSPD and RSFQ on the same chip has not yet been reported. Some RSFQ circuits of the prior art that would be relevant to pulse measurement include an analog-to-digital converter and a time-to-digital converter, which are disclosed in the following patent: U.S. Pat. No. 6,653,962, Gupta et al., Superconducting dual function digitizer. Such circuits are known to permit both sensitive voltage measurements and accurate timing.

A final key aspect of the prior art comprises fabrication techniques for fabricating multiple-layer superconducting integrated circuits (ICs). A cross-section for one such prior-art IC process from Hypres, Inc. (disclosed in U.S. Pat. No. 8,301,214, Tolpygo, et al, System and method for providing multi-conductive-layer metallic interconnects for superconducting integrated circuits) is shown in FIG. 7. Similar fabrication methods have been disclosed in the following patents:

U.S. Pat. No. 5,055,158, Gallagher et al., Planarization of Josephson integrated circuit U.S. Pat. No. 7,615,385, Tolpygo, Double-masking technique for increasing fabrication yield in superconducting electronics U.S. Pat. No. 8,951,808, Ladizinsky et al., Systems and methods for fabricating superconducting integrated circuits US 2015/0119253, Yohannes et al., Method for increasing the integration level of superconducting electronic circuits Other prior art on nanowire detectors and their applications is disclosed in the following patents and patent applications:

US 2013/0172195, Bellei, et al., Optical detectors and associated systems and methods.

US 2014/0353476, Bachar, Fiber optical SNSPD.

U.S. Pat. Nos. 6,812,464; 7,049,593, Sobolewski, et al., Superconducting single photon detector.

U.S. Pat. No. 7,078,694, Polonsky, et al., System and method for spatial, temporal, energy-resolving detection of single photons.

U.S. Pat. No. 8,565,844, Smith, Number-resolving SNSPD via multilayer hardware architecture.

U.S. Pat. No. 8,577,430, Smith, Number resolving SNSPD on multiple surfaces of a substrate.

U.S. Pat. No. 8,761,848, Berggren, Nanowire-based detector.

U.S. Pat. No. 8,872,109, Ohkubo et al, High-speed particle detector for discriminating charge states of ions.

U.S. Pat. No. 9,240,539, Nam, Efficient polarization indendent single photon detector.

U.S. Pat. No. 9,500,519, Tang et al, Superconducting single photon detector.

WO 2011/040809, Dorenbos, et al., Readout of superconducting single photon detectors.

Further aspects of the prior art are disclosed in the following non-patent literature:

Akhlaghi, M., et al., Waveguide integrated superconducting single-photon detectors implemented as near-perfect absorbers of coherent radiation, Nature Communications, 2015, www.nature.com/articles/ncomms9233.

Annunziata, A., et al., Nb SNSPDs, IEEE Transactions on Applied Superconductivity, 2009 arxiv.org/ftp/arxiv/papers/0901/0901.1146.pdf.

Atikian, H., SNSPD on Diamond, Applied Physics Letters, 2014, arxiv.org/pdf/1401.4490.pdf.

Baek, B., et al., SNSPD in an optical cavity for front-sie illumination, Applied Physics Letters, 2009, ws680.nist.gov/publication/get_pdf.cfm?pub_id=903071.

Beyer, A., et al., WSi superconducting nanowire single-photon test structures fabricated using optical lithography, IEEE Transactions on Applied Superconductivity, 2015, www.researchgate.net/profile/Adriana_Lita/publication/273918634_Tungsten_Silicide_Superco nducting_ Nanowire_Single-Photon_Test_Structures_Fabricated_Using_Optical_Lithography/.

Brandel, O. et al, "RSFQ electronics for controlling superconducting polarity switches", Superconductor Science and Technology, Volume 25, Number 12 (10/25/2012) iopscience.iop.org/article/10.1088/0953-2048/25/12/125012/meta.

Calandri, N., et al., Superconducting nanowire detector jitter limited by detector geometry, Applied Physics Letters, 2016, arxiv.org/ftp/arxiv/papers/1607/1607.06713.pdf.

Chen, S., et al., Time-of-flight laser ranging and imaging at 1550 nm using low-jitter superconducting nanowire single-photon detection system, Applied Optics, 2013. arxiv.org/ftp/arxiv/papers/1304/1304.7447.pdf.

Cheng, R, et al., Self aligned multichannel superconducting nanowire avalanche photodetector, ArXiv preprint, 2016, arxiv.org/abs/1601.01719.

Cheng, R., et al., Large-Area Superconducting Nanowire Single-Photon Detector With Double-Stage Avalanche Structure, IEEE Trans. Appl. Supercond., 2017 arxiv.org/pdf/1612.05822.

Cheng, R., et al., Large-Area Superconducting Nanowire Single-Photon Detector With Double-Stage Avalanche

7

Structure, IEEE Transactions on Applied Superconductivity, 2017. arxiv.org/ftp/arxiv/papers/1612/1612.05822.pdf.

Dauler, E., et al., "Review of SNSPD system design options and demonstrated performance", Optical Engineering, vol. 53, article 081907, 2014.

Doerner, S., et al., Operation of Multi-Pixel Radio-Frequency Superconducting Nanowire Single-Photon Detector Arrays, IEEE Transactions on Applied Superconductivity, 2017. arxiv.org/ftp/arxiv/papers/1612/1612.02228.pdf.

Ferrari, S., et al., Hot-spot relaxation time current dependence in niobium nitride waveguide-integrated superconducting nanowire single-photon detectors, Optics Express, 2017. www.osapublishing.org/abstract.cfm?uri=oe-25-8-8739.

Gaudio, R., et al., Inhomogeneous critical current in nanowire superconducting single photon detectors, Applied Physics Letters, 2014, arxiv.org/ftp/arxiv/papers/1412/1412.0416.pdf.

Hadfield, R., "Single-photon detectors for optical quantum information applications", Nature Photonics, vol. 3, p. 696, 2009.

Hu, X., et al., SNSPDs integrated with optical nano-antennae, Optics Express, 2011, www.osapublishing.org/oe/abstract.cfm?uri=oe-19-1-17.

Ivry, Y., et al., Superconducting-superconducting hybridization for enhancing single-photon detection, ArXiv preprint 2017. arxiv.org/abs/1703.08034.

Kahl, O., et al., "Spectrally resolved single-photon imaging with hybrid superconducting-nanophotonic circuits", ArXiv preprint, 2016. arxiv.org/abs/1609.07857.

Kerman, A., et al., "Electrothermal feedback in SNSPDs", Physical Review B, vol. 79, article 100509, 2009.

Kerman, A., et al., Readout of SNSPDs at high count rates, Journal of Applied Physics, 2013, arxiv.org/pdf/1302.2852.pdf.

Kitaygorsky, J., et al., Amplitude distributions of dark counts and photon counts in NbN superconducting single-photon detectors integrated with the HEMT readout, Physica C: Superconductivity, 2017. www.qnp.aphys.kth.se/polopoly_fs/1.694393!/1-s2.0-S0921453416302374-main.pdf.

Li, H., et al., Superconducting nanowire single photon detector at 532 nm and demonstration in satellite laser ranging, Optics Express 2016, www.osapublishing.org/oe/abstract.cfm?uri=oe-24-4-3535.

Li, J., et al., Nano-optical single-photon response mapping of waveguide integrated MoSi superconducting nanowires, Optics Express, 2016, www.osapublishing.org/oe/abstract.cfm?uri=oe-24-13-13931.

Lita, A., et al., Materials development for high efficiency SNSPDs, Materials Research Society Proceedings, 2015, ws680.nist.gov/publication/get_pdf.cfm?pub_id=918625.

Lobanov, Y., et al., Heterodyne spectroscopy with superconducting single-photon detector, EPJ Web of Conferences, 2017. www.epj-conferences.org/articles/epjconf/pdf/2017/01/epjconf_spectro2017_01005.pdf.

Marsili, F., et al., High efficiency NbN nanowire superconducting single photon detectors fabricated on MgO substrates from a low temperature process, Optics Express 2008 www.osapublishing.org/oe/abstract.cfm?uri=oe-16-5-3191.

Mei, Y., et al., Fabrication of superconducting NbN meander nanowires by nano-imprint lithography, Chinese Physics B, 2016, cpb.iphy.ac.cn/article/2016/1806/cpb_25_1_17401.html.

Miki, S., et al., "Development of SNSPD system with Gifford-MacMahon Cryocooler", IEEE Transactions on Applied Superconductivity, vol. 19, p. 332, 2009.

Miki, S., et al., Stable, high-performance operation of a fiber-coupled superconducting nanowire avalanche photon detector, Optics Express, 2017 www.osapublishing.org/oe/abstract.cfm?uri=oe-25-6-6796.

Najafi, F., et al., Fabrication process yielding saturated nanowire single photon detectors with 24-ps jitter, IEEE Journal of Selected Topics in Quantum Electronics, 2015. dspace.mit.edu/openaccess-disseminate/1721.1/102455.

Najafi, F., et al., On-chip detection of non-classical light by scalable integration of single photon detectors, Nature Communications, 2015, www.nature.com/articles/ncomms6873.

Natarajan, C., M. Tanner, and R. Hadfield, "SNSPDs: Physics and Applications", Superconductor Science and Technology, vol. 25, article 063001, April 2012.

ORNL, "Plasmonics: A promising path for Future Interconnects", The Next Wave, v.20, No. 3, pp. 12-18 (2014) www.nsa.gov/resources/everyone/digital-media-center/publications/the-next-wave/assets/files/TNW-20-3.pdf.

Rath, P., et al., Superconducting single-photon detectors integrated with diamond nanophotonic circuits, Light: Science and Applications, 2015. www.nature.com/lsa/journal/v4/n10/full/lsa2015111a.html.

Romestain, R., et al. "Fabrication of a superconducting niobium nitride hot electron bolometer for single-photon counting." New Journal of Physics 6.1 (2004): 129. www.researchgate.net/profile/Corentin_Jorel/publication/230985905_Fabrication_of_a_superco nducting_niobium_nitride_hot_electron_bolometer_for_s-ingle-photon_counting/links/0a85e5310b813a791c000000.pdf.

Rosfjord, K., et al., Nanowire single photon detector with an integrated optical cavity and antireflection coating, Optics Express 2006, www.osapublishing.org/oe/abstract.cfm?uri=oe-14-2-527.

Schmidt, K., et al., AlN-buffered superconducting NbN nanowire single-photon detector on GaAs, IEEE Transactions on Applied Superconductivity, 2017, arxiv.org/ftp/arxiv/papers/1609/1609.09694.pdf.

Schuck, C., et al, NbTiN superconducting nanowire detectors for visible and telecom wavelengths single photon counting on Si3N4 photonic circuits, Applied Physics Letters, 2013, arxiv.org/ftp/arxiv/papers/1302/1302.0786.pdf.

Shainline, J., et al., Superconducting optoelectronic circuits for neuromorphic computing, ArXiv Preprint 2016, arxiv.org/abs/1610.00053.

Shubata, H., et al., Ultimate low system dark count rate for SNSPD, Optics Letters, 2015, www.osapublishing.org/ol/abstract.cfm?uri=ol-40-14-3428.

Sibson, P., et al., Chip-based quantum key distribution, Nature Communications, 2017 www.ncbi.nlm.nih.gov/pmc/articles/PMC5309763/.

Slichter, D., et al., UV-sensitive superconducting nanowire single photon detectors for integration in an ion trap, ArXiv preprint, 2016, arxiv.org/abs/1611.09949.

Smirnov, K., et al., Rise times of voltage pulses in NbN superconducting single photon detectors, Applied Physics Letters, 2016, arxiv.org/ftp/arxiv/papers/1606/1606.04860.pdf.

Sprengers, J., et al., Waveguide single-photon detectors for integrated quantum photonic circuits, Applied Physics Letters, 2011, arxiv.org/ftp/arxiv/papers/1108/1108.5107.pdf.

Stern, J., and W. Farr, Fabrication and characterization of NbN SNSPDs, IEEE Transactions on Applied Superconductivity, 2007, trs.jpl.nasa.gov/bitstream/handle/2014/40253/06-2657.pdf?sequence=1.

Still further aspects of the prior art are disclosed in the following references:

Szete, M., et al, Plasmonic structure integrated single-photon detectors optimized to maximize polarization contrast, IEEE Photonics Journal, 2017 ieeexplore.ieee.org/stamp/stamp.jsp?arnumber=7891903.

Tanner, M., et al., Enhanced telecom wavelength single photon detection with NbTiN superconducting nanowires on oxidized silicon, Applied Physics Letters 2010 authors.library.caltech.edu/65316/1/Enhanced_tele-come.pdf.

Tanner, M., et al., SNSPD on Lithium Niobate, Nanotechnology, 2012, publicationslist.org/data/r.j.warburton/ref-528/Tanner_Nanotechnology_2012.pdf.

Tyler, N., et al., Modelling superconducting nanowire single photon detectors in a waveguide cavity, Optics Express, 2016, www.osapublishing.org/oe/abstract.cfm?uri=oe-24-8-8797.

Verma, V., et al., High efficiency SNSPDs fabricated from MoSi thin films, Optics Express 2015, www.osapublishing.org/oe/abstract.cfm?uri=oe-23-26-33792.

Verma, V., et al., SNSPDs fabricated from an amorphous MoGe film, Applied Physics Letters, 2014, arxiv.org/ftp/arxiv/papers/1402/1402.4526.pdf.

Vorobyov, V., et al, Superconducting detector for visible and near-infrared quantum emitters, Optical Materials Express, 2017, www.osapublishing.org/ome/abstract.cfm?uri=ome-7-2-513.

Wang, Z., et al., SNSPDs for quantum information and communication, IEEE Journal of Selected Topics in Quantum Electronics, 2009, arxiv.org/ftp/arxiv/papers/1003/1003.0227.pdf.

Wu, J., et al., Improving the timing jitter of a superconducting nanowire single-photon detection system, Applied Optics, 2017 www.osapublishing.org/abstract.cfm?uri=ao-56-8-2195.

Xu, F., et al., Experimental fast quantum random number generation using high-dimensional entanglement with entropy monitoring, Optica, 2016, www.osapublishing.org/optica/abstract.cfm?uri=optica-3-11-1266.

Yamashita, T., et al., Origin of intrinsic dark count in SNSPDs, Applied Physics Letters, 2011, arxiv.org/pdf/1103.2844.

Yamashita, T., et al., Superconducting nanowire single-photon detectors with non-periodic dielectric multilayers, Scientific Reports, 2016, www.ncbi.nlm.nih.gov/pmc/articles/PMC5076433/.

Yamashita, T., S. Miki, and H. Terai, "Recent progress and application of SNSPDs,"

IEICE Transactions on Electronics, vol. E100-C, p. 274, March 2017.

Yang, J., et al., Fabrication development for nanowire GHz-counting-rate single photon detectors, IEEE Transactions on Applied Superconductivity, 2005, www.dtic.mil/dtic/tr/fulltext/u2/a574649.pdf.

You, L., et al., Jitter analysis of SNSPD, AIP Advances, 2013. aip.scitation.org/doi/pdf/10.1063/1.4817581.

Zadeh, I., et al., Single-photon detectors combining near unity efficiency, ultra-high detection-rates, and ultra-high time resolution, ArXiv preprint, 2016, arxiv.org/abs/1611.02726.

Zhang, W., et al., Superconducting Nanowire Single-Photon Detector With a System Detection Efficiency Over 80% at 940-nm Wavelength, IEEE Photonics Journal, 2016, ieeexplore.ieee.org/abstract/document/7434560/.

Zhao, Q. et al., "Single-Photon Imager Based on Microwave Plasmonic Superconducting Nanowire" (2016) arxiv.org/ftp/arxiv/papers/1605/1605.08693.pdf.

Zhao, Q., et al., Single-Photon Imager Based on Microwave Plasmonic Superconducting Nanowire, ArXiv preprint 2016, arxiv.org/abs/1605.08693.

Zhao, Q., et al., SNSPD linear array, Applied Physics Letters, 2013, dspace.mit.edu/openaccess-disseminate/1721.1/85962.

Zhao. Qing-Yuan, et al. "Single-photon imager based on a superconducting nanowire delay line." Nature Photonics 11.4 (2017): 247-251. www.nature.com/nphoton/journal/v11/n4/full/nphoton.2017.35.html.

SUMMARY OF THE INVENTION

Aspects of the present technology provide an SNSPD detector system that is faster than prior art systems, having lower timing uncertainty than prior art systems, and/or is monolithically integrated with cryogenic readout that can count and time pulses. Of course, other advantages are apparent.

In a preferred embodiment, an integrated nanowire detector of the invention comprises at least one nanowire, a Josephson junction in series with the nanowire to maintain an accurate current bias, a small voltage bias that decreases the reset time, and superconducting digital readout electronics. This is shown in FIG. 8A for a single nanowire, although it will be generally applied to a parallel array of nanowires (FIG. 11). FIG. 8A shows a single Josephson junction in series with the nanowire, with a small voltage bias (for example, 0.1 mV) applied to the series combination. FIG. 8B shows V(I) for the nanowire and for the Josephson junction, where the voltages of the two devices are not drawn to scale (the nanowire has a much larger impedance). The critical current of the Josephson junction is selected to be slightly less than that of the nanowire (for example, 90%), so that when no photon is present, the voltage is applied across the junction, in the regime where the junction V(I) is almost vertical. This effectively current-biases the nanowire at $I_c$ of the junction when no photon is present, and improves its immunity to noise. When a photon is absorbed in the nanowire, the nanowire switches very quickly into its high-voltage resistive state, but because of the applied voltage, the current is quickly reduced, which enables the nanowire to recover its superconducting state. When this happens, the current starts to increase again, being limited by the Josephson junction.

Note that while FIG. 8A may appear similar to the biasing scheme FIG. 4, the operation is quite different in the two cases. In FIG. 4, the Josephson junction and inductor serve to maintain the current bias in the RSFQ device when the device is either active or passive. In contrast, in FIG. 7A, where the nanowire itself is also an inductor, the current bias is maintained only in the passive state of the nanowire. In the active state of the nanowire, it switches back to a voltage bias. Further, the nanowire is a high-impedance, high-voltage device which is not based on single-flux-quanta, quite unlike the low-impedance, low-voltage RSFQ devices in FIG. 4.

While most nanowires of the prior art comprise long meander lines, the nanowire in FIG. 8A is deliberately drawn as a straight line, which is not too long. Preferably, the inductance of the nanowire may be much lower than that typical of the prior art, such as 1 nH or less. However, any shape of the nanowire is possible, including a line with two or more legs. Partly as a consequence of the reduced inductance, the reset time is less than 1 ns, and preferably less than 0.1 ns. Further, due to the shorter line length, which reduces the uncertainty in the propagation delay, the timing jitter will preferably be less than 10 ps. That is, the sensed time of the pulse represents the time of the event, plus the propagation time from the position of impact, to the sensing element. For a sensor that has a large sensing area, i.e., a long serpentine trace, the detection time will vary depending on where on the trace the pulse is intersected. The sensor has no resolution of this position, and therefore any pulse has an uncertainty of at least the entire trace distance, represented as a propagation time. Therefore, a shorter trace of a sensor naturally has less uncertainty of timing measurement.

FIG. 8A shows a basic nanowire detector integrated with RSFQ readout. When the nanowire switches, it generates a voltage pulse, which converts the nanowire pulse to an SFQ pulse. The SFQ pulses may be counted in an RSFQ counter, and also timed in an RSFQ time-to-digital converter (TDC). Not shown is the RSFQ clock, and the digital output lines that carry the digital data from the cryogenic environment to room temperature.

Given that the nanowire pulse is larger and slower than the SFQ pulse, the SFQ pulse converter in FIG. 9 comprises an appropriate threshold device. One such threshold device is a known as a DC/SFQ converter (see, e.g., www.physics.sunysb.edu/Physics/RSFQ/Lib/AR/dcsfq.html), which can be configured to generate a single SFQ pulse on the rising edge of a larger voltage pulse.

Both RSFQ counters and TDCs are known in the prior art, and are based on toggle flip-flops. See, for example, U.S. Pat. No. 6,653,962, Superconducting Dual Function Digitizer, and also Mukhanov, O., and S. Rylov, "Time to digital converters based on RSFQ digital counters", IEEE Transactions on Applied Superconductivity, vol. 7, p. 2269, 1997.

There are several additional approaches to further refine aspects of the present invention. FIGS. 10A and 10B show that a SQUID may be used as a tunable Josephson junction, in place of the single Josephson junction shown in FIG. 8A. With a control current (or equivalently, a control magnetic field) applied to the loop inductance of the SQUID, the critical current of the SQUID may be adjusted in-situ to improve the response of the nanowire. If the bias current of the nanowire is too small, then the quantum efficiency in response to low-energy photons will be reduced. If the bias current is too large, then there may be some "dark current", pulses due to thermal fluctuations or noise in the absence of photons. Given some statistical variance in the critical current of both the nanowire and the junctions, the ability to tune the bias current to optimize the response may provide significant improvement.

FIG. 10A also shows another aspect that may improve the response, a resistive shunt line in parallel with the nanowire. This resistive shunt line will carry no current when the nanowire is in its resistive state, but it will act to divert current quickly when a photon-induced hotspot becomes resistive. This will help to speed up the reset of the nanowire, even for a single Josephson junction. In the case of a SQUID, this shunt line may additionally be configured to couple magnetic flux into the SQUID loop in a way that decreases its critical current, further accelerating the reset of the nanowire.

FIG. 10B shows a configuration whereby the control current to the SQUID comprises a circulating supercurrent in a multi-flux-quantum (MFQ) memory cell. This may have advantages in scaling to large number of nanowires, since this will reduce the number of required external control lines. This would also permit digital control of the critical currents of the SQUIDs.

FIG. 11 shows scaling of the nanowire detector of FIG. 8A to a plurality of nanowires biased in parallel. These nanowires are preferably very close, such as 100 nm between neighboring lines, much less than the wavelength of light. In this way, a good detection efficiency over a local region can be obtained, similar to that of a nanowire meander-line in the prior art. Preferably, the number N of parallel nanowires should be 10 or more, unlike the avalanche nanowire detector of US 2013/0143744, where the number is restricted to less than about 5. The mode of operation in the two approaches is quite different. In both cases, switching of one of the parallel legs will cause redistribution of current to the other legs. However, the avalanche devices are configured so that this distribution causes adjacent nanowires to successively switch following the first switching event, creating a large voltage across the entire parallel array. In contrast, the parallel nanowires of the current invention are preferably designed so that a single nanowire switching does NOT cause any of the others to switch. In this case, the resulting voltage pulse will be "shorted out" by the parallel lines, and the pulse would be virtually undetectable by a conventional measuring instrument several meters away at room temperature. However, the devices of the present invention are preferably closely coupled to sensitive, fast RSFQ devices, which are capable of detecting even mV, sub-ns voltage pulses. This would not be possible in the prior art.

Note also that the parallel array in FIG. 11 is shown to be current-biased, which may be more convenient to implement. However, given the parallel connection, when one leg switches, it is essentially being voltage-biased by the other legs in the array, consistent with FIG. 8A. Note also that the voltage output of the parallel array is being read out from the top electrode, which includes the voltage across the Josephson junctions, which generates ps SFQ pulses. The Pulse Discriminator can distinguish SFQ pulses from slower photon-induced pulses in the nanowires.

FIGS. 12 and 13 show cross-sections of a deposition process for superconducting Nb-based integrated circuits, modified to include a bottom nanowire layer. The nanowire layer may comprise 5-10 nm of NbN, or another alternative superconducting material such as NbTiN, TiN, WSi, Nb, MoSi, MoGe, MoN, TaN, and WRe. This enables close monolithic integration of nanowire and SFQ digital circuits. Further, given its high kinetic inductance, the nanowire layer can serve to enable compact high-inductance devices for SFQ circuits. In addition, other superconducting devices based on nanowires (such as those in U.S. Pat. No. 9,509, 315, McCaughan et al., "Superconducting three-terminal device and logic gates") may also be integrated with both nanowire photon detectors and SFQ circuits.

The substrate preferably comprises a single-crystal silicon wafer, but other alternatives include GaAs, sapphire, quartz, glass, or MgO. The Josephson junctions preferably comprise Nb/Al/AlOx/Nb multilayers, but other tunnel barriers and electrodes may also be used. For example, the superconductor may comprise NbN, with a barrier of aluminum nitride or magnesium oxide. For Nb junctions, alternative barriers may comprise aluminum nitride, NbSi alloys, or layers containing a magnetic or ferromagnetic element. The insulating layer separating wiring layers may comprise silicon dioxide. The resistive layer may comprise Mo or MoN. A top electrical contact layer may comprise Au. The multilayer process may include one or more steps of planarization.

The integration of the nanowires and the Josephson junction circuits may occur in three dimensions. For example, the Josephson junctions in series with the nanowires can be above the nanowires in the stack. However, this requires that the photons be coupled to the nanowires from below. One way to achieve this is by illumination of the nanowire through a transparent substrate, as shown in FIG. 12. In a preferred embodiment, the substrate comprises a silicon crystal, which is transparent to infrared photons with wavelength greater than about 1.5 microns. Alternative substrates that are transparent in the visible regime include sapphire (crystalline aluminum oxide), glass, and quartz. An alternative approach to back-illumination, illustrated in FIG. 13, is for the nanowire to be coupled to an optical waveguide integrated in the substrate. The optical waveguide may comprise a silicon nitride waveguide, as for example disclosed in U.S. Pat. No. 9,500,519, Tang, et al., "Superconducting single photon detector".

There are some advantages in having the nanowire layer being the first layer deposited on the substrate. For example, if the nanowire is thermally strongly coupled to a good thermal conductor such as a single-crystal substrate, that may assist in the cooling of the local hotspot, which helps in the reset of the nanowire detector. In addition, deposition of a high-quality nanowire layer may require heating to elevated temperatures, which might be deleterious to the properties of thin tunnel barriers for Josephson junctions. However, inverting the deposition sequence and depositing the nanowire layer on top may also be appropriate in some cases.

Fabrication of the nanowires requires precision nanolithography to obtain uniform lines that are 100 nm wide or less. This may be achieved using electron beam lithography or precision ultraviolet lithography. Josephson junctions may be defined using anodization, with transverse dimensions that may preferably be smaller than about 1 micron. The critical current density of the Josephson junctions may be about 10 $\mu A/\mu m^2$, or about 10 $\mu A$ for a 1 $\mu m^2$ junction. This should be comparable to the bias currents for the nanowires. Alternatively, for a critical current density of about 0.1 $mA/\mu m^2$, a junction with $I_c$=10/$\mu A$ could correspond to a junction 300 nm×300 nm.

Applications of integrated nanowire detectors may include both digital communications and imaging. For digital communication, the detector can operate up to higher data rates than those in the prior art, due to the much shorter reset time. Application to systems that are already cryogenic may be particularly valuable, such as superconducting digital processors. For example, one could send a periodic optical pulse train at 10 GHz or more down an optical fiber from a room-temperature optical pulse generator. If the superconducting digital processor is integrated with an ultrafast integrated nanowire detector, the optical pulses can be converted to SFQ electrical pulses, serving as a clock signal for the superconducting digital processor.

Another application for nanowire detectors is for time-correlated single-photon counting (TCSPC), as shown in the block diagram of FIG. 14. See U.S. Pat. No. 6,342,701, Kash, "Time Correlated Photon Counting"; see also Stevens, M., et al., "Time-correlated single photon counting with superconducting single-photon detectors", SPIE vol. 6372, 2006. Note that the nanowires of the present technology should exhibit both narrower pulsewidth and reduced timing jitter than those of the prior art, due to the shorter nanowire length. Given high quantum efficiency, low detector jitter, and picosecond time resolution and measurement, a matched pair of superconducting nanowire detectors with integrated TDCs should be ideal for such a system. TCSPC has been used for time-resolved spectroscopy, but has also been applied to quantum communications with entangled single photons.

One innovative mode of quantum communication is known as quantum key distribution, illustrated in FIG. 15. Alice is sending a message to Bob, and Eve may be cavesdropping. See, for example, US 2017/0026175, Zhang et al., "Methods for quantum key distribution and related devices"; see also Takemoto, K., et al., "Quantum key distribution over 120 km using ultra-high-purity single photon source and superconducting single-photon detectors", Scientific Reports, vol. 5, article 14383, 2015. Nanowire detectors with closely integrated TDCs should permit quantum key distribution at much higher data rates than those of the prior art.

Another requirement for cryptography and secure communication is a random number generator, and a quantum random number generator may be among the most secure. See, for example, U.S. Pat. No. 7,284,024, Trifonov et al., "Quantum random noise number generator"; see also Herrero-Galantes, M., "Quantum random number generators", Reviews of Modern Physics, vol. 89, 015004 (2017). As shown in FIG. 16, nanowire detectors with closely integrated TDCs should permit quantum random number generation at much higher data rates than those of the prior art.

For fast and efficient focal-plane imaging, a dense two-dimensional array of detectors is required, each with its own readout. This is illustrated in FIG. 17, which shows a repeated array of parallel nanowires, each with a Josephson junction in series. While each element of the array has its own RSFQ counter, an appropriate digital multiplexer may be used to read out the counts from each element of the array with a minimum of input/output lines. See, for example, Sahu, A., et al., "Digital time-division multiplexing readout circuit for sensor arrays", IEEE Transactions on Applied Superconductivity, vol. 27, article 2500106, 2017. Each pixel is on the scale of the wavelength of light, while the entire array can cover many wavelengths, with good quantum efficiency across the entire range.

FIGS. 18A and 18B show two preferred embodiments of the cryogenic packaging of the integrated nanowire detectors. FIG. 18A may be optimized for communication, with optical pulses transmitted to the integrated SNSPD (or iSNSPD) via an optical fiber. FIG. 18B may be optimized for focal plane imaging, and shows an image being projected optically through a window to the iSNSPD array. In both cases, the iSNSPD is mounted in a vacuum on a two-stage cryocooler (such as a commercial Gifford-McMahon cooler), where temperatures close to 4 K can be achieved without the need for liquid cryogens. While similar packaging has previously been demonstrated for SNSPDs (see, for example, Miki, S., et al., "Development of SNSPD system with Gifford-MacMahon Cryocooler", IEEE Transactions on Applied Superconductivity, vol. 19, p. 332, 2009), full integration with cryogenic digital readout has not previously been implemented.

In summary the faster reset time and close digital integration enables the integrated nanowire detectors to provide superior performance for a variety of applications in digital communication and imaging.

It is therefore an object to provide a nanowire photon detector, comprising: an integral substrate; at least one superconducting nanowire, the at least one superconducting nanowire being configured to absorb photons emitted from a photon source and being supported by the integral substrate; an electrical current bias source, coupled to the at least one nanowire, configured to generate a voltage pulse along the nanowire, upon absorption of at least a single photon; and at least one superconducting Josephson junction circuit, formed at least partially on the integral substrate, electrically connected with the at least one nanowire, and being configured to: control the electrical bias current source; receive the generated voltage pulse generated by the electrical current bias source; produce a changed logic state after receipt of the generated voltage pulse, and produce at least one output signal.

The at least one superconducting Josephson junction circuit may comprise a superconducting quantum interference device (SQUID). The SQUID may have a critical current, further comprising a control circuit configured to tune the critical current of the SQUID. The control circuit may be configured to adjust the control current to optimize a quantum efficiency of the detector with respect to the source of photons. The control circuit may be configured to maximize a quantum efficiency of the detector with respect to the source of photons. The control circuit may be configured to vary the control current by insertion of at least one magnetic flux quantum into a superconducting storage loop.

The nanowire photon detector may further comprise an optical waveguide integrated in the integral substrate, configured to couple the photons emitted from the photon source to the at least one superconducting nanowire. The nanowire photon detector may further comprise an optical fiber, configured to couple the photons emitted from the photon source to the at least one superconducting nanowire. The nanowire photon detector may further comprise a lens, configured to couple the photons emitted from the photon source to the at least one superconducting nanowire.

The at least one superconducting Josephson junction circuit may be further configured to produce the changed logic state after receipt of the generated voltage pulse representing a pulse count. The nanowire photon detector may further comprise a time-correlated single-photon counting module.

The at least one superconducting Josephson junction circuit may be further configured to produce the changed logic state after receipt of the generated voltage pulse representing a pulse timing.

The at least one superconducting nanowire may comprise a plurality of closely-spaced nanowires which are biased in parallel.

The at least one superconducting Josephson junction circuit may comprise rapid-single-flux-quantum (RSFQ) logic. The RSFQ logic may operate at a clock frequency greater than about 10 GHz, 15 GHZ, 20 GHz, 25 GHZ, 30 GHz, 35 GHz, 40 GHz, 50 GHz, 60 GHz, 70 GHz, 80 GHz, 90 GHz, or 100 GHz.

The at least one superconducting Josephson junction circuit may operate at a cryogenic temperature less than 10 K or 1 K.

The nanowire photon detector system may further comprise a closed-cycle refrigerator configured to cool the at least one superconducting Josephson junction circuit to a cryogenic operating temperature.

The at least one superconducting Josephson junction circuit may be configured to generate the at least one output signal as pulses at a rate of greater than 1 GHz, 2 GHZ, 3 GHZ, 4 GHz, 5 GHZ, 6 GHZ, 7 GHZ, 8 GHZ, 9 GHZ, 10 GHz, 15 GHZ, 20 GHZ, 25 GHZ, 30 GHz, 35 GHz, 40 GHz, 50 GHz, 60 GHz, 70 GHz, 80 GHz, 90 GHz, or 100 GHz.

The at least one superconducting nanowire may comprise a plurality of nanowires in a spatial array. The at least one superconducting Josephson junction circuit may be configured to: receive the pulse outputs from the plurality of nanowires, and produce the at least one output signal representing a spatial and temporal image of the photon source.

The nanowire photon detector system may further comprise a quantum random number generator, a receiver for a quantum optical communication system, e.g., of classical type, a single-photon receiver forming part of a quantum key distribution system, and/or a receiver for an optical digital communication system, for example.

It is another object to provide a method of fabricating an integrated superconducting nanowire single photon detector on a substrate, comprising: depositing a superconducting detector layer, and patterning the deposited superconducting detector layer into a plurality of nanowires; depositing a Josephson junction trilayer, and patterning the deposited Josephson junction trilayer into a plurality of Josephson junctions; depositing a plurality of superconducting wiring layers and a plurality of insulating layers, which are together patterned into a plurality of superconducting isolated interconnects interconnecting connecting the plurality of nanowires and the plurality of Josephson junctions; and depositing at least one resistive layer, and patterning the deposited resistive layer into at least one bias resistor and at least one shunt resistor.

The method may further comprise depositing a contact layer, and patterning the deposited contact layer into a plurality of electrical contacts for connections external to the integrated superconducting nanowire single photon detector.

The substrate may comprise a silicon wafer.

The substrate may be transparent to a source of photons.

The superconducting detector layer may comprise at least one of the following materials: NbN, Nb, MoN, MoSi, TiN, MoGe, WSi, NbSi, WRe, NbTiN, and TaN.

The superconducting detector layer may be less than or equal to 10 nm thick.

At least one patterned nanowire may have a width of less than about 100 nm.

The plurality of nanowires may be patterned by a process comprising electron beam lithography.

The Josephson junction trilayer may comprise top and bottom electrodes comprising niobium or niobium nitride with a thin interlayer comprising aluminum oxide or aluminum nitride.

The patterning of the Josephson junction trilayer to form the plurality of Josephson junctions may comprise at least one step of anodization.

The plurality of Josephson junctions may comprise at least one patterned Josephson junction having a transverse dimension of less than 1 micron.

The at least one superconducting wiring layer may comprise a material selected from the group of metallic niobium and niobium nitride.

At least one of the plurality of insulating layers may comprise silicon dioxide.

At least a portion of boundaries between the plurality of superconducting wiring layers and the plurality of insulating layers may be planarized.

The resistive layer may comprise molybdenum.

The method may further comprise fabricating an integrated optical waveguide on the same substrate as the integrated superconducting nanowire single photon detector. The integrated optical waveguide may comprise silicon nitride. The superconducting detector layer may be deposited on top of the waveguide.

An integrated superconducting nanowire single photon detector on a substrate may have any combination or subcombination of any of the aforementioned features, and be formed by any combination or subcombination of the foregoing steps.

It is a further object to provide an integrated nanowire photon detector, comprising: an integral substrate; at least one superconducting nanowire, the at least one superconducting nanowire being configured absorb photons emitted from a photon source and being supported by the integral substrate; an electrical current bias source, coupled to the at least one nanowire, configured to generate a voltage pulse along the nanowire, upon absorption of at least a single photon; and at least one superconducting Josephson junction circuit, formed on the integral substrate, electrically connected with the at least one nanowire, configured to at least control the electrical bias current source.

BRIEF DESCRIPTION OF THE FIGURES

FIG. 1A shows a photon being absorbed to produce a local hotspot. FIG. 1B shows a current-voltage characteristic in the absence of photons. FIG. 1C shows a sequence of voltage pulses associated with absorption of photons.

FIG. 3A shows a schematic of a shunted junction model (RCSJ). FIG. 3B shows a current-voltage characteristic of a shunted Josephson junction. FIG. 3C shows a sequence of single-flux-quantum pulses generated by a Josephson junction.

FIG. 5A shows a circuit schematic of a SQUID with a control current. FIG. 5B shows the current-voltage characteristic of a SQUID for two different values of the control current. FIG. 5C shows the critical current of the SQUIID as a function of the control current.

FIG. 8A shows a circuit schematic of a nanowire in series with a Josephson junction. FIG. 8B shows the operation of the detector, with the switching of the nanowire upon absorption of a photon.

FIG. 10A shows a shunt-feedback line. FIG. 10B shows a multi-flux-quantum (MFQ) memory cell providing the control current to the SQUID.

FIG. 18A shows a system with an optical fiber for communication. FIG. 18B shows a system with an optical window for focal plane imaging.

DETAILED DESCRIPTION OF THE INVENTION

Further details on the prior art, on the preferred embodiments of the invention, and on the figures are disclosed below.

Figures 1A, 1B, 1C:
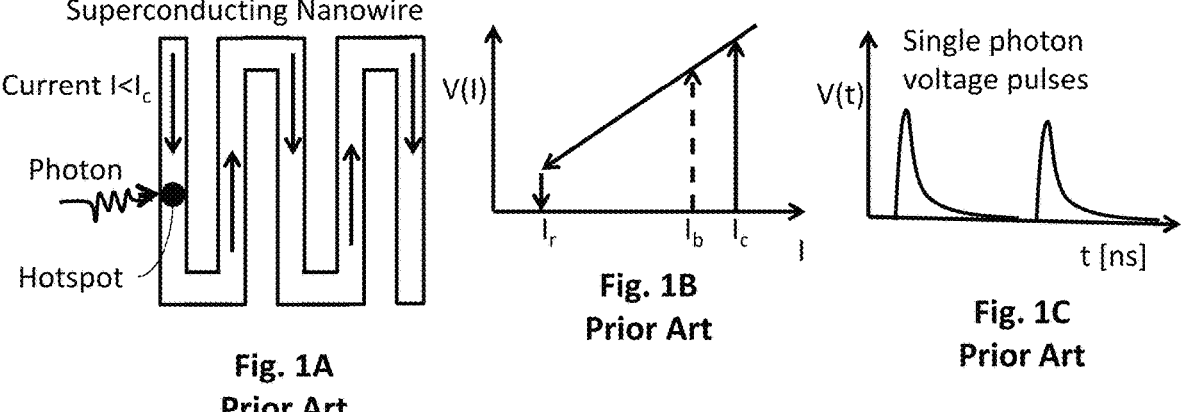
FIGS. 1A, 1B and 1C present a superconducting nanowire of the prior art.

FIG. 1A shows a drawing of a superconducting nanowire patterned into a meander line, which is typical of devices in the prior art. The nanowire needs to cover a large fraction of the area on the scale of the wavelength, since otherwise the absorption coefficient would be quite small. The nanowire must be both very thin and very narrow, so that the energy from an absorbed single photon is sufficient to raise the local electron temperature T above the critical temperature $T_c$ of the superconductor, or at least to reduce the local critical current $I_c$ (T) to below the bias current $I_b$. It is essential that the critical current along the entire length be as uniform as possible, requiring a homogenous ultrathin film with excellent nanolithography. Once the local critical current is exceeded, the local region of the nanowire becomes resistive, and starts to generate heat itself, so that this is an avalanche process that may lead to the entire length of the nanowire becoming resistive. If the current in the device remains constant, the device will latch, and never return to its superconducting state, as shown in FIG. 1B. That is why it is essential for most of the current to be diverted out of the nanowire (such as to a 50-Ohm load), so that the remaining current can be reduced to below a return current $I_r$. The pulse height may correspond to the resistance of the entire nanowire, with a voltage that may be of order 100 mV or more. The pulsewidth reflects the time to divert the current to a load, which is typically on the order of nanoseconds, due mostly to the large kinetic inductance of the nanowire. This assumes that the device cools quickly once the current is diverted, which requires good thermal conduction to the substrate.

Figure 2:
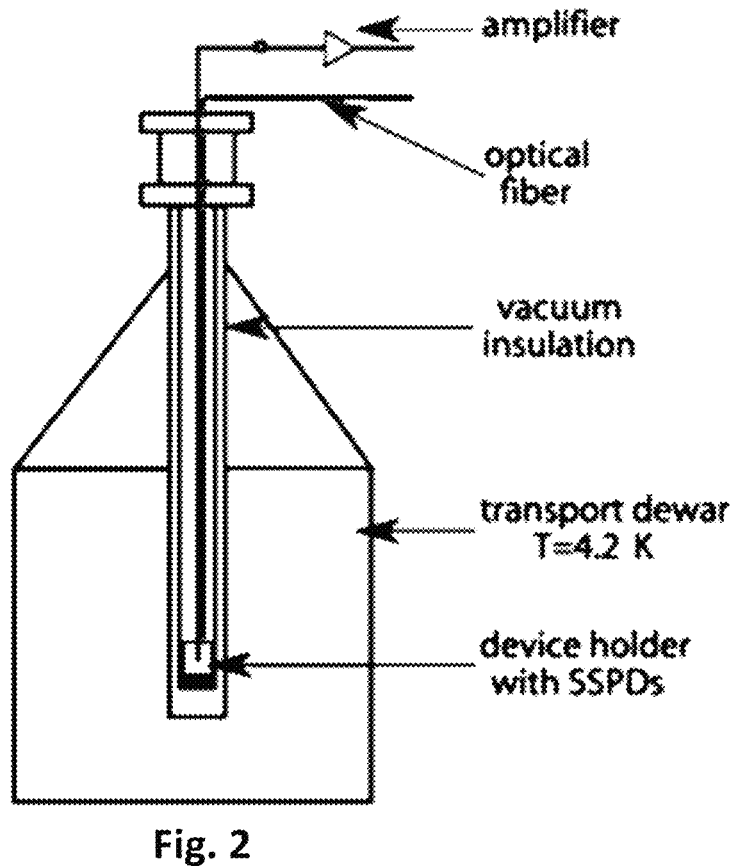
FIG. 2 shows a superconducting nanowire detector measurement apparatus of the prior art.

FIG. 2 shows a conventional prior-art measurement configuration, where the nanowire (here called an SSPD) is inside a vacuum chamber, cooled to about 4 K using liquid helium. The photons are carried to the nanowire using an optical fiber from a source at room temperature, and the pulse is carried out over a coaxial line to an amplifier at room temperature, typically several meters from the nanowire. If the pulse is large and relatively slow, as typical for the prior art, this will work well.

In contrast, the current invention uses much shorter lines with lower inductance, and other techniques to reduce the reset time to below 1 ns. This should enable the current in the nanowire to redistribute before the hotspot has spread to the entire nanowire, so that the peak voltage will also be sharply reduced toward the mV level. This would require amplification close to the nanowire, at low temperatures, in order to send the pulses to room temperature without getting lost in the noise. But in the integrated SNSPD, a sensitive superconducting circuit can measure a small, fast signal right next to the nanowire, without the need for amplification.

Figures 3A, 3B, 3C:
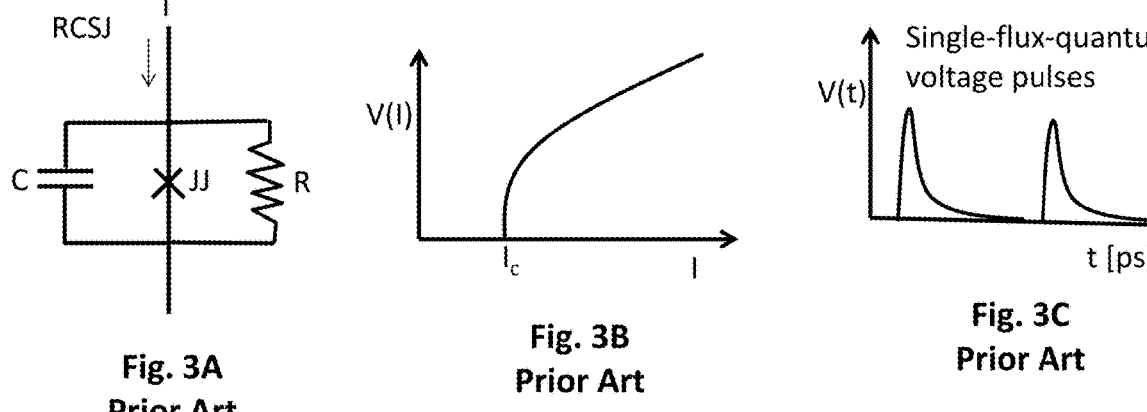
FIGS. 3A, 3B and 3C show a Josephson junction of the prior art.
Figure 4:
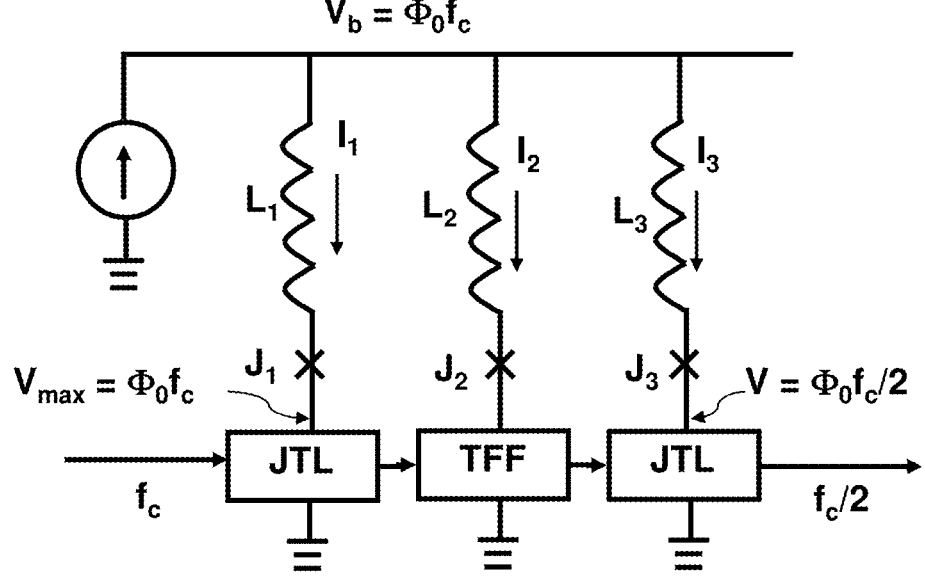
FIG. 4 shows a low-power current biasing scheme for single-flux-quantum circuits of the prior art.
Figures 5A, 5B, 5C:
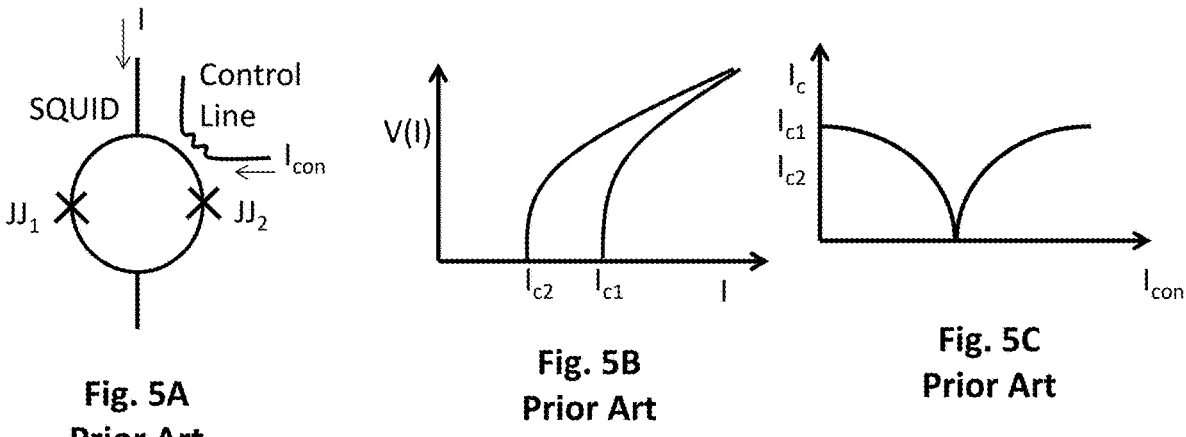
FIGS. 5A, 5B and 5C show a SQUID of the prior art.

Josephson junctions, SQUIDs, and RSFQ circuits are well known in the prior art, and are addressed in FIGS. 3-5. While real Josephson junctions exhibit various fine structures in the I-V characteristic, the junctions are generally modeled using the resistively and capacitively shunted junction model (RCSJ, FIG. 3A), and most applications are critically damped (or slightly overdamped) to avoid hysteresis above the critical current $I_c$. In some cases, this may require an external resistive shunt. The Josephson junctions in FIG. 4 and later (represented by the X) represent these damped junctions. The stable operation with a vertical I-V characteristic (shown in FIG. 3B) for a current just above $I_c$ effectively converts a current bias to a voltage bias. In this regime, the instantaneous voltage actually corresponds to a periodic sequence of single-flux-quantum (SFQ) voltage pulses at a frequency $f=<V>/\Phi_0$, each with height around 1 mV and pulsewidth around 2 ps, as shown in FIG. 3C. For example, a 50 GHz pulse sequence corresponds to an average voltage $<V>$ about 0.1 mV.

Rapid Single-Flux-Quantum Logic is the leading low-power logic technology for superconducting circuits. RSFQ circuits make use of these SFQ pulses for digital logic, based on damped Josephson junctions. Despite the "quantum" in the name, this is not a form of quantum computing. These circuits are generally biased below their critical current, so that they expend no power until an SFQ pulse enters an input. Two of the basic pulse routing elements in RSFQ circuits are the Josephson transmission line (JTL) and the toggle-flip-flop (TFF) (see www.physics.sunysb.edu/Physics/RSFQ/Lib/contents.html). As shown in FIG. 4, a pulse enters a JTL on the left, and leaves to the right. Of pulses entering a TFF on the left, every other pulse leaves to the right. This circuit acts as a binary frequency divider, whereby a periodic input pulse train entering at frequency $f_c$ leads to an output pulse train at half the frequency $f_c/2$. In order to function properly, each of these elements must be current-biased at a current slightly below their critical current. The standard method of current biasing RSFQ circuits comprises a common voltage bias with a bias resistor in each leg, but this produces static power dissipation. FIG. 4, taken from U.S. Pat. No. 8,571,614, shows an alternative method of bias current distribution with a series (superconducting) inductance and Josephson junction, where the critical current of the Josephson junction in a given leg defines the bias current in that leg. This eliminates the static power dissipation, has only a much smaller dynamic power dissipation associated with the passage of SFQ pulses, and provides the basis of one form of energy-efficient RSFQ logic. It is not obvious that a similar biasing scheme can be applied to other superconducting devices, particular those that are not based on SFQ pulses.

SQUIDs represent a class of superconducting devices present throughout superconducting electronics, including RSFQ logic. This is summarized in FIGS. 5A-5C, which show the properties of the two-junction SQUID, also called the de-SQUID. Each of the two junctions is actually a shunted junction, modeled as a CRSJ. In the present context, the SQUID can be viewed as a Josephson junction with a tunable value of critical current. This tuning can be carried out using an isolated control line which is inductively coupled to the SQUID loop. The tuning may also be produced by an external magnetic field, producing a magnetic flux in the SQUID loop. The tuning is periodic in the magnetic flux quantum $\square_0$. For this reason, both SQUIDs and RSFQ circuits normally operate inside magnetic shields, in order to suppress undesired variability of parameters.

Figure 6:
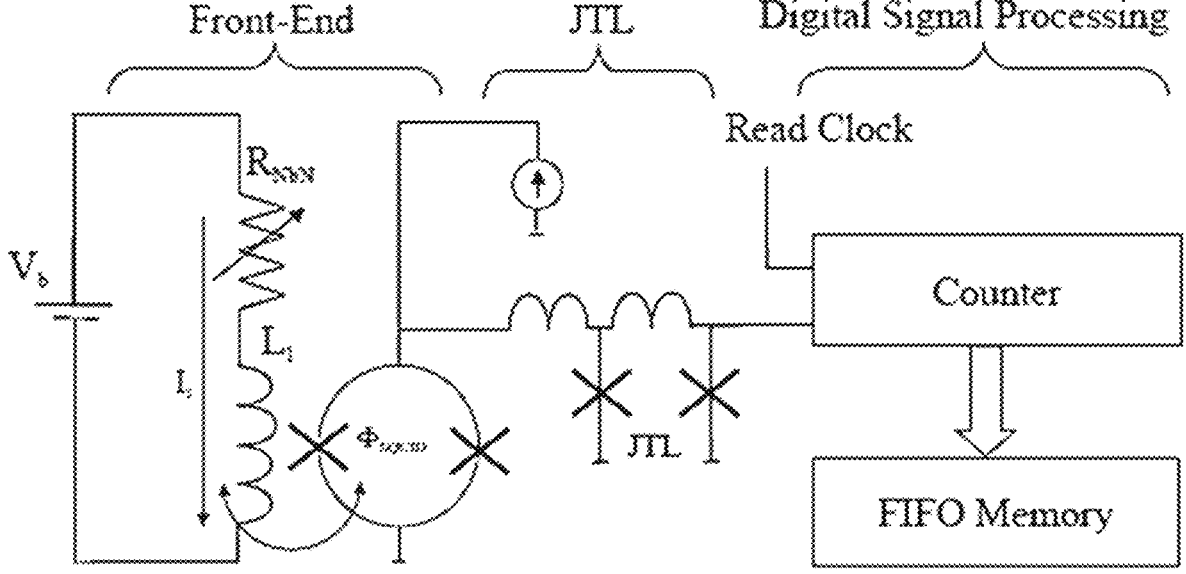
FIG. 6 shows a SQUID-coupled nanowire output circuit proposed in the prior art, but not implemented.

In some cases, it would be of interest to examine the detailed shape of the nanowire pulse, and determine how that correlated with photon energy. That was the motivation of the output circuit disclosed by Gupta and Kadin in FIG. 6 (from "Single-photon-counting hotspot detector with integrated RSFQ readout electronics", IEEE Transactions on Applied Superconductivity, vol. 9, p. 4487, 1999), using a SQUID inductively coupled to the nanowire current as a fast analog-to-digital converter (ADC). The variable resistance represents the hotspot detector (operating in a slightly different regime), and the series inductor is coupled to a SQUID that generates SFQ pulses at a rate proportional to the signal, which can be counted in an RSFQ counter. This was intended to help to determine how pulse amplitude and width correlated with photon energy. This system was never actually implemented. In contrast to this early work, the present invention focuses on counting and timing the output pulses of a practical nanowire detector, rather than carefully measuring their pulse shape.

Figure 7:
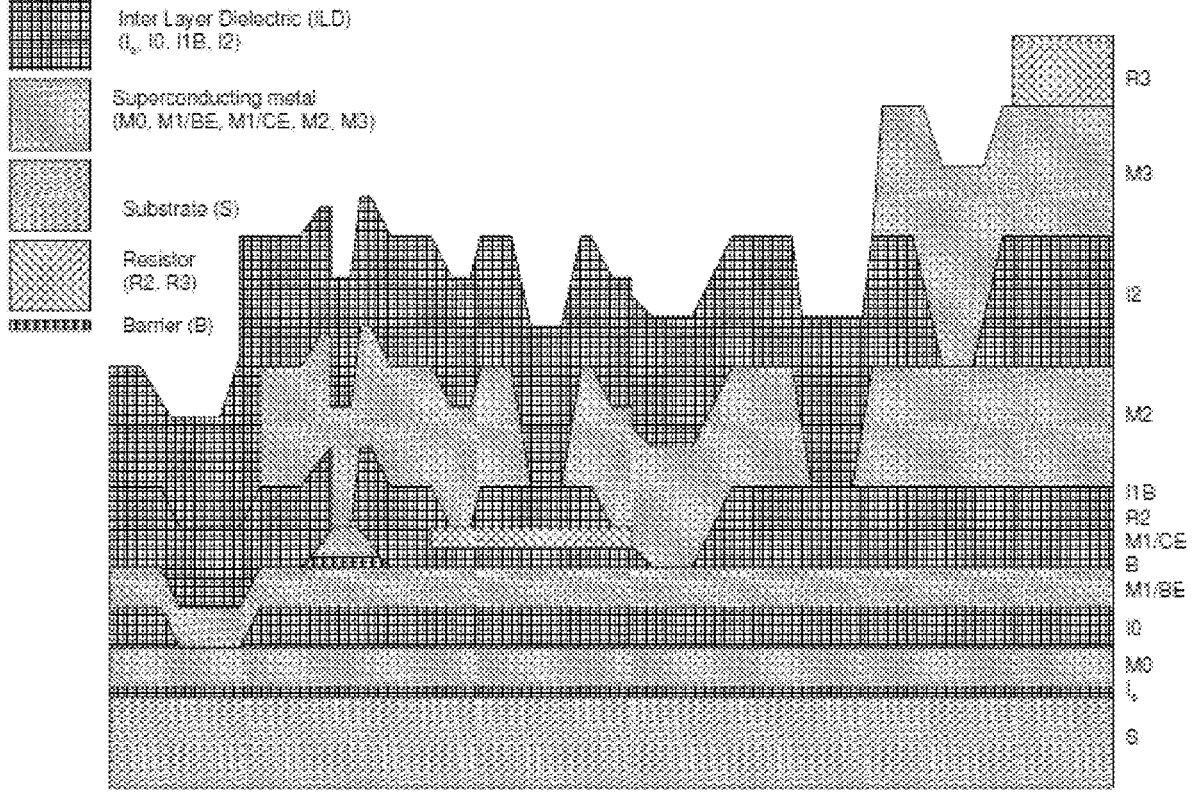
FIG. 7 shows a cross-section of a multilayer thin film process for manufacturing superconducting circuits of the prior art.

Superconducting integrated circuits based on Josephson junctions are well known in the art, for applications that include voltage standards, data converters, digital processors, quantum computing, and sensor arrays. FIG. 7 shows a cross section of a prior art IC process for Nb Josephson junctions as developed by Hypres, Inc. This includes 4 layers of superconducting Nb wiring (M0, M1, M2, and M3), where M0 is generally used as a ground plane. M1 represents the Josephson junction trilayer, with a base electrode (BE), a tunnel barrier layer B, and a counter electrode (CE). The tunnel barrier is produced by depositing a very thin layer of Al, and partially oxidizing it. The thickness of the $Al_2O_3$ tunnel barrier layer is of order 1 nm, which may correspond to critical current densities of order 10-100 $\mu A/\mu m^2$. An anodization process is applied to define the Josephson junction areas. Also included is a resistor layer R2, a top contact layer (R3) and several insulator layers (Is, I0, I1B, and I2) separating the Nb layers. The substrate is generally a silicon crystal, although it is not electrically part of the superconducting circuit; at cryogenic temperatures near 4 K, the silicon is virtually an insulator. Given the sensitivity of the tunnel barrier to high temperatures (they degrade at temperatures of 200° C.), all processes are designed to avoid elevated temperatures. There are also prior-art planarized multilayer processes, which permit additional layers, see, for example, US 2015/0119253. Furthermore, there are also prior art fabrication processes optimized for nanowires.

Figure 11:
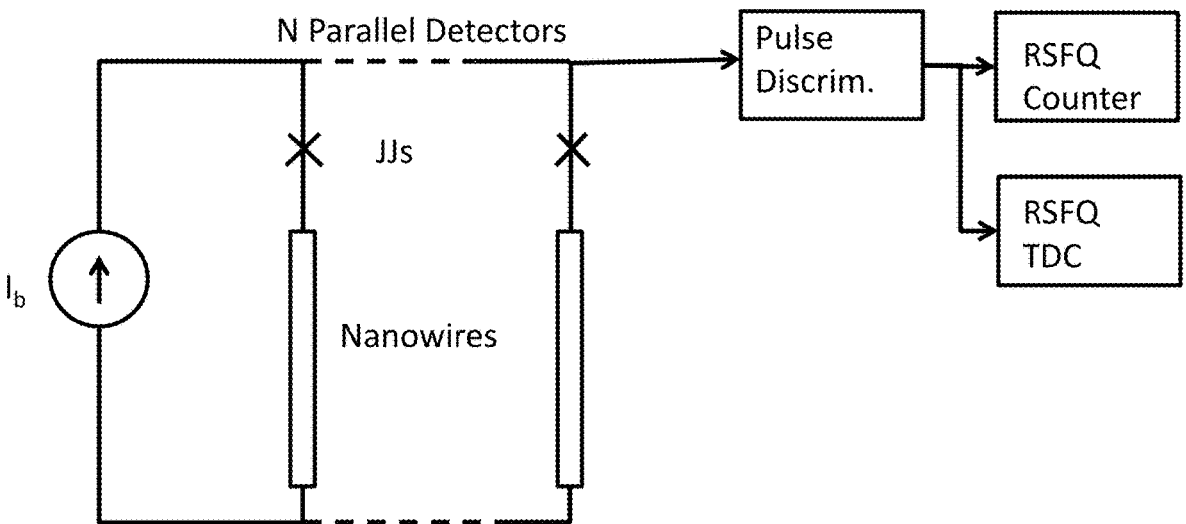
FIG. 11 shows an embodiment of a nanowire detector comprising a parallel array of nanowires, with the digital circuits processing pulses from the entire array.
Figure 12:
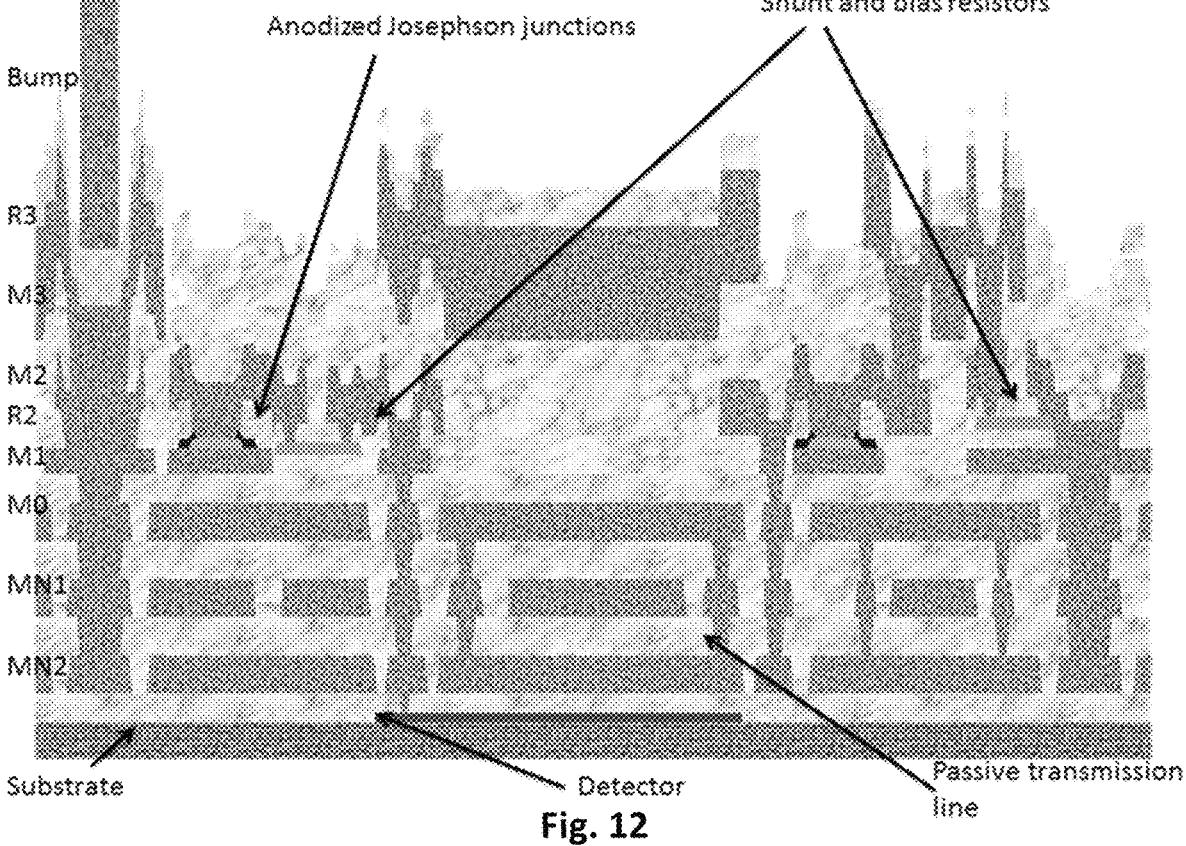
FIG. 12 shows a cross-section of a multilayer deposition process for an integrated nanowire photodetector, configured for optical illumination through the substrate.

FIGS. 11 and 12 disclose a new process that combines both Josephson junctions and nanowires in the same multilayer process.

Figures 8A, 8B:
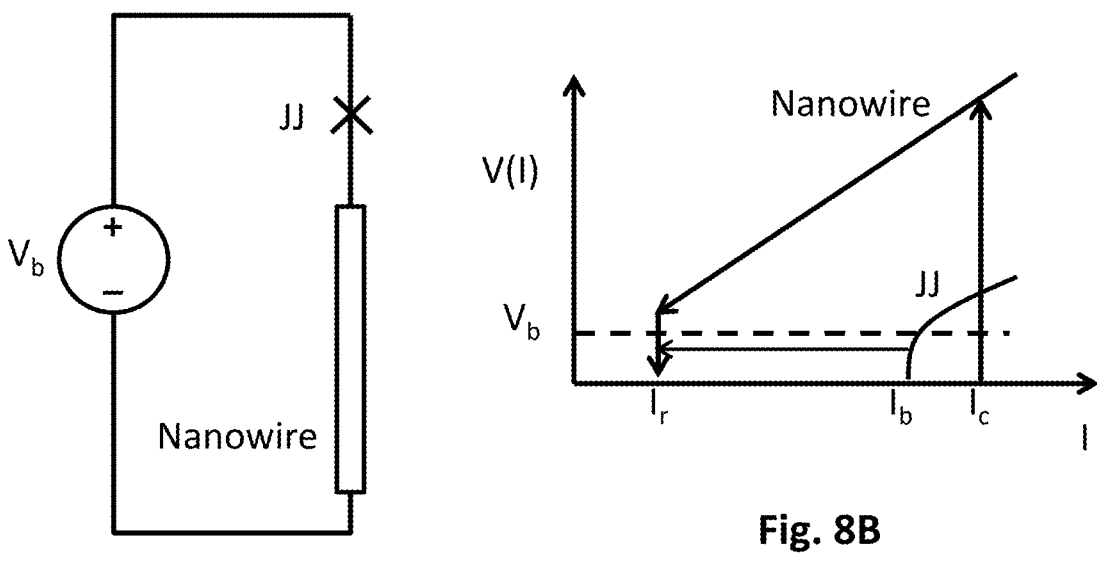
FIGS. 8A and 8B show one embodiment of a basic integrated nanowire detector of the present invention.
Figures 10A, 10B:
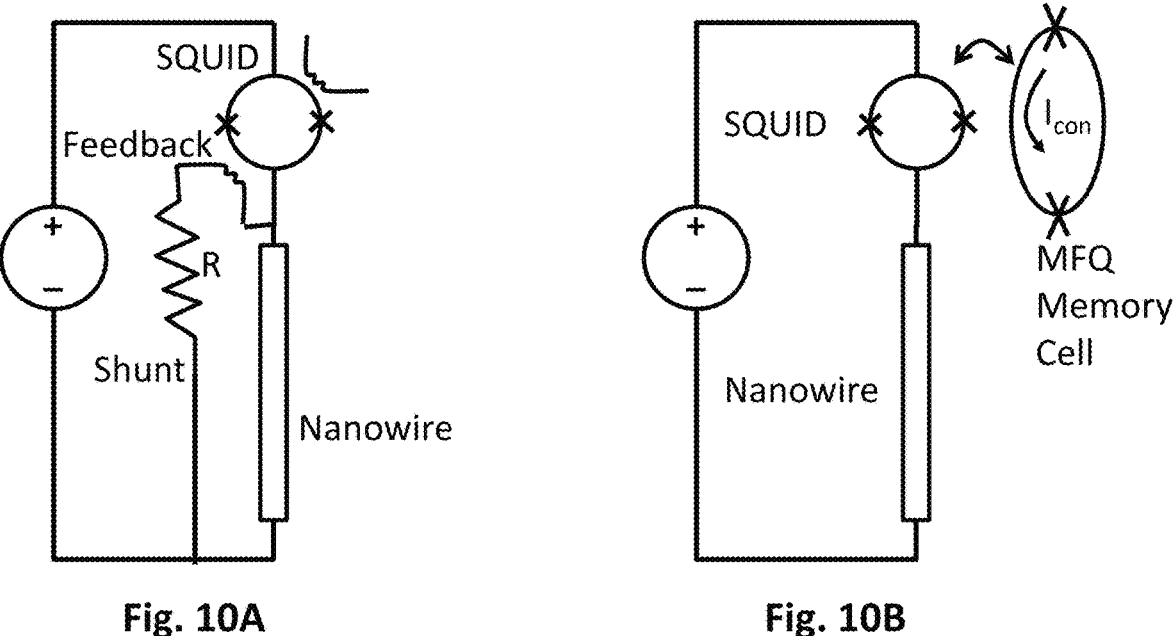
FIGS. 10A and 10B show schematics of two embodiments of a nanowire detector with a SQUID.

One aspect of the invention combines a nanowire and a Josephson junction in the same circuit, as shown in FIG. 8A. These are voltage-biased in series at a low voltage that may be of order 0.1 mV, on the vertical part of the Josephson junction V(I). This maintains the bias current $I_b$ in the nanowire at slightly more than the critical current of the junction, which is less than the critical current $I_c$ of the nanowire. The bias current may typically be designed to be about 90% of $I_c$. The characteristic voltage of the Josephson junction, at which it changes from a vertical part to a resistive part is typically of order 0.2-1.0 mV, depending on the critical current density and the damping parameter. If a larger bias voltage is desired, two or more identical junctions in series could be used. The nanowire may be a straight line, which may typically be of order 100 nm wide by 1000 nm long, with a kinetic inductance L of order 1 nH or less. When a photon is absorbed in the nanowire, the voltage across the nanowire rises very quickly, causing the current in the nanowire to drop sharply in a time of order L/R in order to try to maintain the voltage bias, where R is the source resistance of the voltage bias. This current redistribution time should be less than 1 ns, and preferably less than 0.1 ns, so that the nanowire may be rapidly reset to accept another photon. Such a short time should prevent local heating from spreading to the entire nanowire, which will also enable more rapid cooling and reset. Another technique to reduce the reset time includes a resistive shunt across the nanowire, as shown in FIG. 10A. The shunt will divert current away from the nanowire if the shunt resistance is smaller than the "on" resistance of the nanowire.

Figure 9:
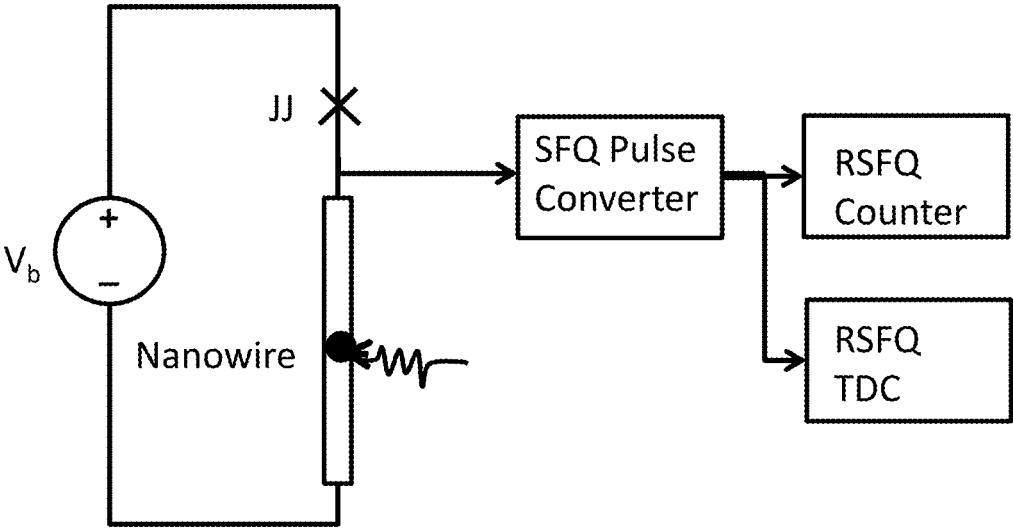
FIG. 9 shows a block diagram of a basic nanowire detector interfaced to an RSFQ digital counter and timer.

Note that the voltage bias will also act to reduce the amplitude of the voltage pulse across the nanowire; for an ideal voltage source, it would be shorted out entirely. FIG. 9 shows the pulse measurement circuit, comprising an SFQ pulse converter together with RSFQ counter and timer. These are closely integrated with the nanowire, and SFQ circuits are very sensitive and very fast. A residual nanowire pulse of order 1 mV with a sub-ns pulsewidth can be easily detected with a DC/SFQ converter or other threshold RSFQ device. The timing of successive pulses may also be measured with a time-to-digital converter (TDC). RSFQ TDCs have been shown in the prior art to have ps resolution. See, for example, Kaplan, S., et al., "Prescalar circuit for superconductive time-to-digital converter," IEEE Transactions on Applied Superconductivity, vol. 11, p. 513, 2001, which discloses a time resolution of 5 ps or less; see also Sarwana, S., et al., "High-sensitivity, high-resolution dual-function signal and time digitizer", Applied Physics Letters, vol. 80, p. 2023, 2002.

The series Josephson junction may alternatively comprise two junctions in parallel, which is essentially a SQUID, as shown in FIGS. 10A and 10B. This has the feature that the critical current of the SQUID may be tuned with a control current that is inductively coupled to the SQUID loop. The inductance of the SQUID loop must not be so large as to trap magnetic flux. Such tuning offers the possibility of a real-time adjustment to enhance the performance of the nanowire. However, as the number of nanowires increases, the number of external control lines may become too large. FIG. 10B suggests that a superconducting memory cell with a persistent current, having a larger loop inductance ($LI_c >> \Phi_0$) able to trap N flux quanta, may be used to provide the control current. An array of such memory cells may be configured as an addressable memory array without a large number of external lines. FIG. 10A also shows that a resistive shunt line may provide feedback to the SQUID loop, decreasing its critical current and decreasing the reset time.

While a single nanowire should be quite fast, it will not be efficient at absorbing photons. For this reason, the integrated nanowire detector will generally be operated as a parallel array, as shown in FIG. 11. Each nanowire is biased by the junction at about $0.90 \times I_c$. Note that if the number of parallel nanowires is small, current diversion upon switching would be likely to cause a cascade of other nanowires switching as well. Indeed, that avalanche effect is the desired mechanism in US 2013/0143744. In the present invention, in contrast, there should preferably be at least about 10 nanowires or more in such an array, so that current diversion is unlikely to cause multiple switching. Current diversion via a resistive shunt will also reduce the likelihood of switching of adjacent nanowires.

Using these techniques, single photon count rates of 1-10 GHz and higher should be possible. Note that RSFQ circuits can easily handle these data rates. Other on-chip digital signal processing can collect, analyze, and store this data on chip, and transmit it at appropriate data rates for further analysis using computers at room temperature.

Figure 13:
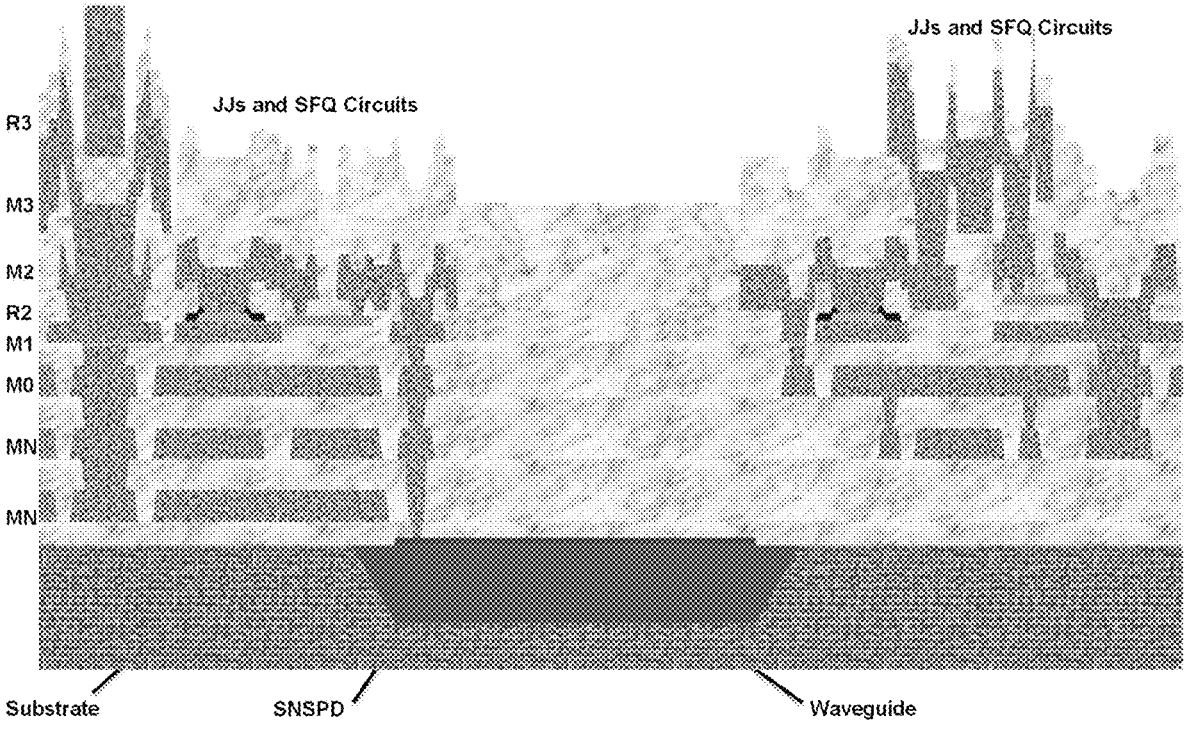
FIG. 13 shows a cross-section of a multilayer deposition process for an integrated nanowire photodetector, configured for optical coupling from an integrated waveguide in the substrate.

FIGS. 12 and 13 disclose how a nanowire layer such as ultrathin NbN may be integrated with an existing Josephson junction IC process. These show, for example, vertical Nb vias that connect a NbN nanowire on the bottom to a Josephson junction in the middle, and to a contact on top.

This integrated structure enables the bias Josephson junction or SQUID to be on the same chip as the nanowire, preferably close to each other. The digital processing can also be on the same chip, although the presence of lossless superconducting striplines (shown in FIG. 12) enables signals to be sent to other parts of the chip with negligible distortion. Alternatively, one can have multiple chips on the same multi-chip module, with appropriate partitioning of detection and processing among the various chips. SFQ pulses can be reliably transmitted between such chips, as shown in the prior art. See, for example, Gupta, D., et al., "High-speed data transmission technology for superconducting multi-chip modules", IEEE Transactions on Applied Superconductivity, vol. 11, p. 731, 2001.

Figure 14:
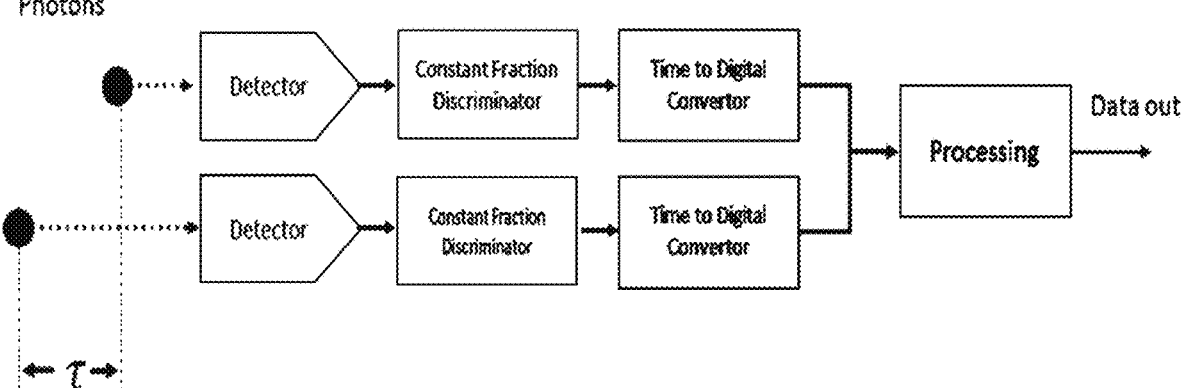
FIG. 14 shows the block diagram of a time-correlated single-photon-counting system.
Figure 15:
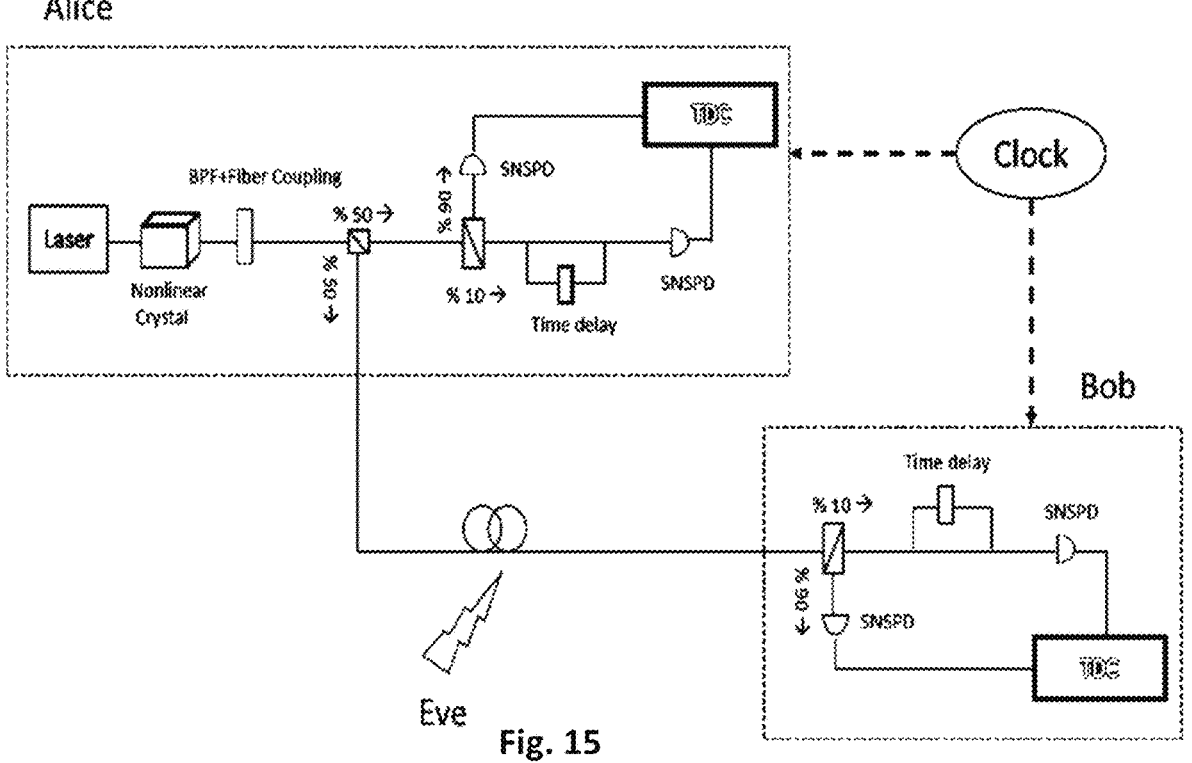
FIG. 15 shows a block diagram of a quantum key distribution system for optical communication, employing a nanowire detector.
Figure 16:
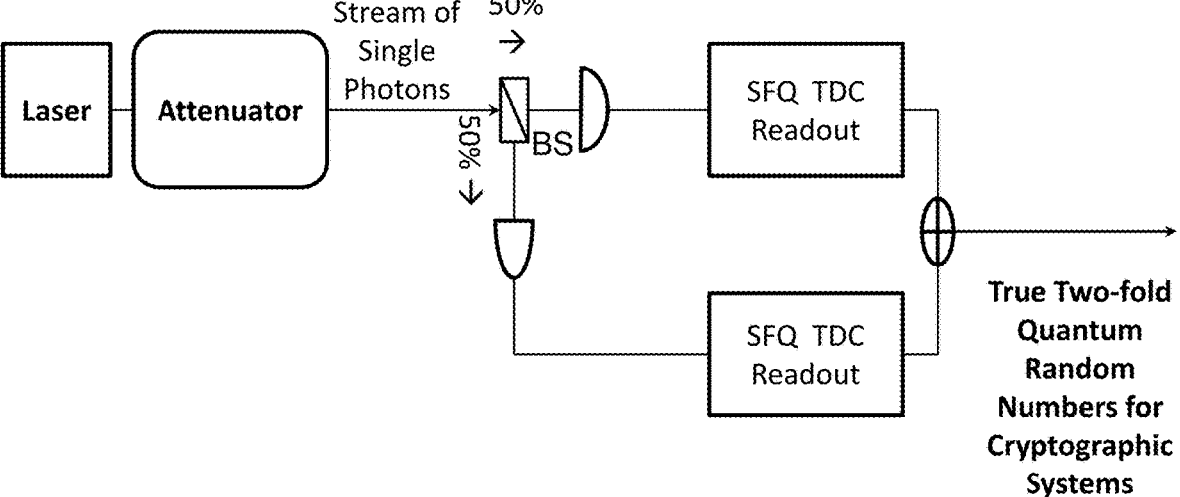
FIG. 16 shows a block diagram of a quantum random number generator employing two nanowire detectors.

FIGS. 14-16 disclose ways that integrated nanowire detectors with precision timing may be used in communications circuits. These all include two (or more) SNSPDs with precision ps timing (10 ps or less) to measure and adjust time correlations. The reduced timing jitter and more precise timing measurement compared to the prior art will facilitate new and improved applications. FIG. 14 shows the generic block diagram of a time-correlated single photon counter (TCSPC) system, which could be implemented on a single superconducting chip. FIG. 15 shows a quantum communication system based on single photons, where the transmitter and receiver each have two SNSPDs integrated with a TDC and variable time delay. Both the TDC and the time delay can be implemented on the same chip, with the same SFQ technology. This comprises a quantum key distribution system. FIG. 16 shows a quantum random number generator enabled by time correlation of dual SNSPDs. This is not itself a communication system, but can be implemented as part of a cryptographic system for communication and other applications.

Figure 17:
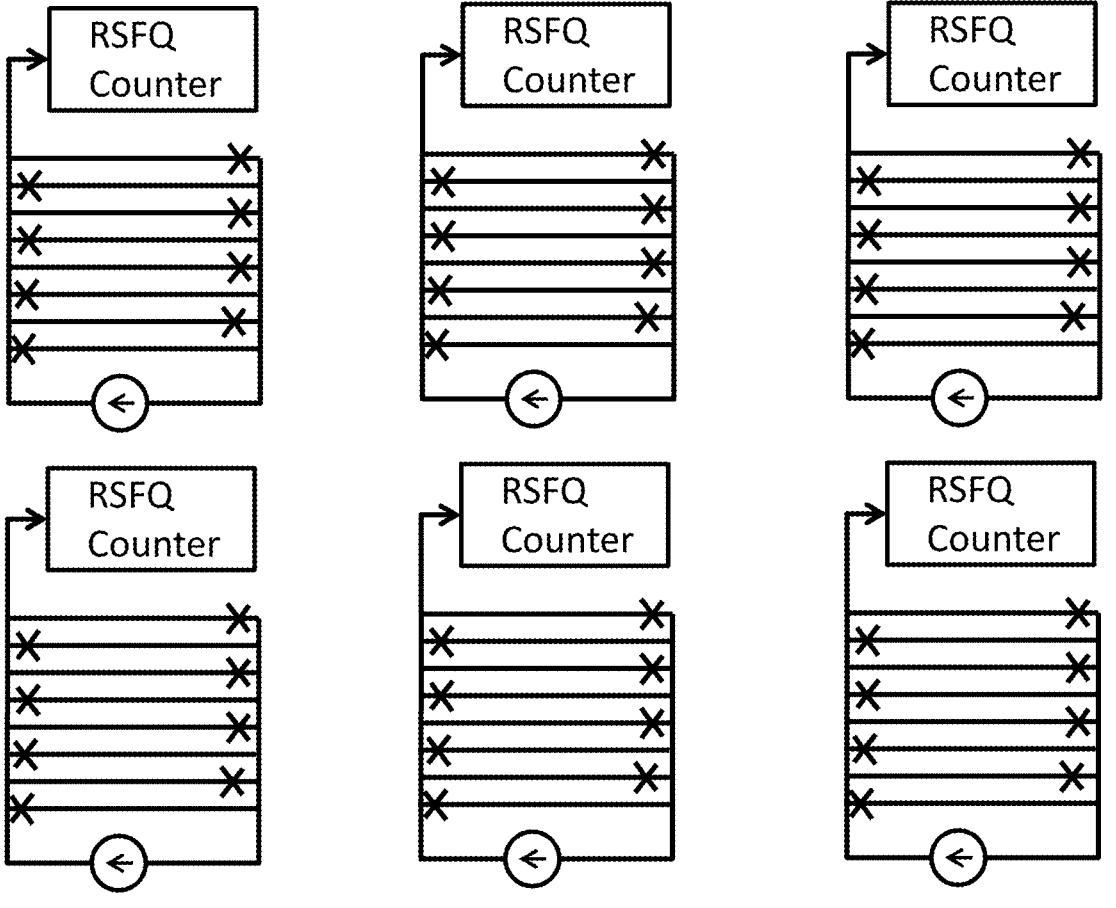
FIG. 17 shows a two-dimensional array of parallel-biased nanowire detectors for imaging.

Beyond communication applications, single-photon focal plane imaging is also an important application, particularly for astronomical applications. This requires an array of detectors, each on the micron scale, but covering an area on the mm scale, as suggested in FIG. 17. One can envision, for example, a 1000×1000 array of sensors, all on the same chip, with both imaging and some digital processing. This would require a million nanowires, each with perhaps 10 parallel lines, together with millions of Josephson junctions. This level of integration exceeds the current level in superconducting microelectronics, but current efforts in other areas of superconducting applications (such as advanced digital computing and quantum computing) are moving in this direction. One could also have a multi-chip module with further digital processing on an adjacent chip in a multi-chip module.

Figure 18A:
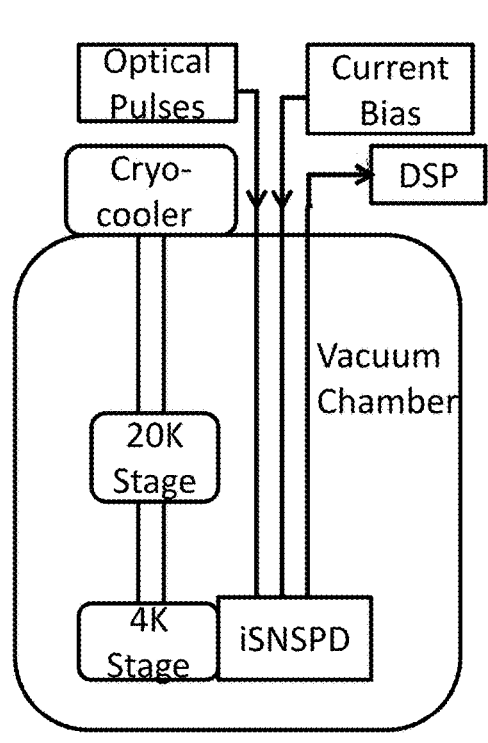
FIGS. 18A and 18B show two block diagrams for cryogenic systems for nanowire detector systems.
Figure 18B:
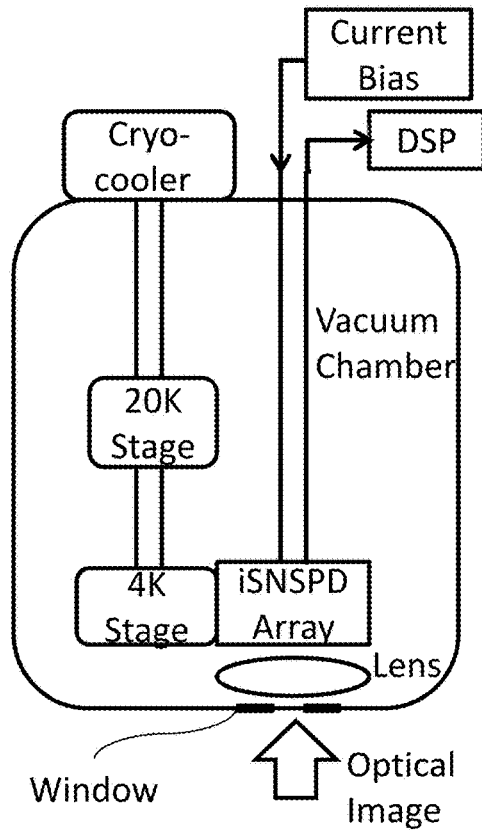

FIGS. 18A and 18B suggest two examples of cryogenic packaging for integrated SNSPD (iSNSPD) systems. Depending on the nanowire material, some applications may operate at lower temperatures of 1 K or less, in a helium-3 cryostat or a dilution refrigerator. This would make the cryogenic packaging a bit more complex, but may reduce noise levels further. In another embodiment, the integrated SNSPD in FIG. 18A may provide the digital input (or even the clock reference) for another superconductor or cryogenic device, such as a superconducting processor or a quantum processor. This will reduce the need for coaxial lines, which conduct a significant amount of heat into the cryogenic environment.

The examples given in this disclosure provide some preferred embodiments of the applications of the integrated nanowire detectors, but many other applications should also follow from the properties disclosed here.

What is claimed is:

1. A photon detector, comprising:
a superconducting nanowire;
a Josephson junction in series with the nanowire;
a bias generator, configured to bias the superconducting nanowire in series with the Josephson junction, such that absent a photon absorbed by the superconducting nanowire the Josephson junction has a bias voltage, and when the photon is absorbed by the superconducting nanowire, the superconducting nanowire generates a voltage pulse,
the superconducting nanowire and the Josephson junction being integrated on a common substrate.

2. The photon detector according to claim 1, wherein absorption of the photon causes a decrease in a critical current of at least a portion of the superconducting nanowire, wherein the bias induces a current above the decreased critical current and the voltage pulse.

3. The photon detector according to claim 1, wherein a kinetic inductance of the superconducting nanowire is 1 nH or less, and the superconducting nanowire is configured to recover from absorption of the photon sufficiently fast to produce voltage pulses at a rate of at least 1 GHz and having a pulsewidth of less than 0.1 ns, wherein.

4. The photon detector according to claim 1, further comprising a circuit configured to control the bias generator to maintain the bias at a level which suppresses spontaneous voltage pulses from the superconducting nanowire.

5. The photon detector of claim 1, further comprising a pulse discriminator circuit configured to convert the voltage pulse to a single-flux-quantum (SFQ) pulse.

6. The photon detector of claim 1, further comprising an digital counter and a time-to-digital converter, wherein the digital counter is configured to count the pulse from the voltage pulse and the time-to-digital converter is configured to determine a pulse latency of the voltage pulse.

7. The photon detector of claim 1, further comprising a circuit configured to tune a critical current of the Josephson junction.

8. The photon detector of claim 1, further comprising a conductive loop, wherein the Josephson junction and the loop are configured as a SQUID.

9. The photon detector of claim 8, wherein the SQUID has a loop current, further comprising a multi-flux-quantum (MFQ) memory cell, wherein a circulating supercurrent in the multi-flux-quantum (MFQ) memory cell is adapted to digitally tune the SQUID by altering the loop current.

10. The photon detector of claim 1, further comprising a shunt resistor in parallel with the superconducting nanowire, having resistance less than a resistance of the superconducting nanowire during the voltage pulse.

11. A photon detector, comprising:
a superconducting quantum interference device, comprising two Josephson junctions within a superconducting inductive loop;
a superconducting nanowire, configured to absorb a photon to cause a temporary and localized decrease in a critical current of the superconducting nanowire, the superconducting nanowire and the superconducting quantum interference device being integrated and configured to operate within a common environment; and
a bias circuit configured to generate a voltage bias across the superconducting nanowire and the superconducting quantum interference device, through the two Josephson junctions in parallel, wherein the critical current of the superconducting nanowire is above a critical current of the two Josephson junctions.

12. The photon detector according to claim 11, further comprising a single flux quantum logic circuit configured to detect a voltage pulse in the superconducting nanowire due to the temporary and localized decrease in the critical current of the superconducting nanowire.

13. The photon detector according to claim 12, wherein the single flux quantum logic circuit is further configured to count a number of voltage pulses in the superconducting nanowire.

14. The photon detector according to claim 12, wherein the single flux quantum logic circuit is further configured to determine a timing of voltage pulses in the superconducting nanowire.

15. The photon detector according to claim 11, further comprising a control circuit magnetically coupled to the superconducting inductive loop, configured to tune the critical current of the two Josephson junctions.

16. The photon detector according to claim 15, wherein the control circuit is configured to add and remove single flux quanta to and from the superconducting inductive loop, to thereby alter a current circulating in the superconducting inductive loop.

17. The photon detector according to claim 16, wherein the bias circuit is configured to establish the bias current at about 90% of the critical current of the superconducting nanowire, and the control circuit is configured to add and remove single flux quanta to and from the superconducting inductive loop to optimize a response of the superconducting nanowire to the photon.

18. The photon detector according to claim 11, wherein the photon detector is configured to operate at an operating cryogenic temperature, further comprising a resistive shunt that remains resistive at the operating cryogenic temperature, to carry current and to couple magnetic flux into the superconducting loop to decrease the critical current of the two Josephson junctions during the voltage spike.

19. The photon detector according to claim 11, wherein the bias circuit comprises a rapid flux single quantum logic circuit.

20. A method of detecting a photon, comprising:
providing a superconducting quantum interference device, comprising two Josephson junctions within a superconducting inductive loop, and a superconducting nanowire, configured to absorb a photon to cause a temporary and localized decrease in a critical current of the superconducting nanowire, the superconducting nanowire and the superconducting quantum interference device being integrated and configured to operate within a common environment;

generating a voltage bias across the superconducting nanowire and the superconducting quantum interference device with a bias circuit, the bias voltage causing a current through the superconducting nanowire and the two Josephson junctions in parallel, wherein the critical current of the superconducting nanowire is above a critical current of the two Josephson junctions;

exposing the superconducting nanowire to the photon, absorbing the photon by the superconducting nanowire, causing the critical current in the superconducting nanowire to drop below the current from the bias voltage, and generating a voltage pulse across the superconducting nanowire.

\* \* \* \* \*